(12) United States Patent
Zhong et al.

(10) Patent No.: US 11,412,633 B2
(45) Date of Patent: Aug. 9, 2022

(54) DETACHABLE COVER MODULE AND CHASSIS HAVING THE SAME

(71) Applicant: Wistron Corporation, New Taipei (TW)

(72) Inventors: Yong-Qing Zhong, New Taipei (TW); Qi Liu, New Taipei (TW); Zhao-Ping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 77 days.

(21) Appl. No.: 17/032,129

(22) Filed: Sep. 25, 2020

(65) Prior Publication Data

US 2022/0030734 A1    Jan. 27, 2022

(30) Foreign Application Priority Data

Jul. 24, 2020 (CN) .......................... 202010723301.2

(51) Int. Cl.
*H05K 7/00* (2006.01)
*H05K 7/14* (2006.01)

(52) U.S. Cl.
CPC .................................. *H05K 7/1488* (2013.01)

(58) Field of Classification Search
CPC ... E05C 1/00; E05C 1/004; E05C 1/08; E05C 1/085; E05C 1/12; E05C 1/14; E05C 1/145; E05C 9/00; E05C 9/002; E05C 9/006; E05C 9/008; E05C 9/02; E05C 9/025; E05C 9/026; E05C 9/028; E05C 9/10; E05C 9/14; E05C 9/22; Y10T 292/0825; Y10T 292/0826; Y10T 292/0828; Y10T 292/0829; Y10T 292/0831;
(Continued)

(56) References Cited

U.S. PATENT DOCUMENTS 3,869,159 A * 3/1975 Eads .......................... E05C 1/14
                                                                70/462
4,875,721 A * 10/1989 Okamoto .................. E05C 9/02
                                                                292/29
(Continued)

FOREIGN PATENT DOCUMENTS

CN      108756540    * 11/2018
EP      3348756      *  7/2018
(Continued)

*Primary Examiner* — Janet M Wilkens
(74) *Attorney, Agent, or Firm* — McClure, Qualey & Rodack, LLP

(57) ABSTRACT

A detachable cover module includes a bezel body, a button, and a sliding member. The button is pivotally connected to the bezel body. The button includes a pushing member. The sliding member includes a connecting portion and a guiding element. When the button is pressed in a first direction, the pushing member pushes the guiding element, so that the connecting portion moves from a position protruding outward from the bezel body toward a position not protruding outward from the bezel body. When the button is not pressed, the connecting portion of the sliding member is normally maintained at the position protruding outward from the bezel body. The detachable cover module is (Continued)

adapted to be pivotally connected to a body of a chassis to selectively expose or cover an opening of the chassis body.

20 Claims, 16 Drawing Sheets

(58) Field of Classification Search
CPC ......... Y10T 292/0834; Y10T 292/0836; Y10T 292/0837; Y10T 292/0839; Y10T 292/084; Y10T 292/0844; Y10T 292/0921; Y10T 292/0922; Y10T 292/0923; Y10T 292/0926; Y10T 292/0928; Y10T 292/0929; Y10T 292/093; Y10T 292/0932; Y10T 292/0945; Y10T 292/0946; Y10T 292/0947; Y10T 292/0948; Y10T 292/0949; Y10T 292/0961; Y10T 292/0962; Y10T 292/0963; Y10T 292/0964; Y10T 292/0967; Y10T 292/0969; Y10T 292/097; Y10T 292/0971; Y10T 292/0974; Y10T 292/0976; Y10T 292/0977; Y10T 292/1014; Y10T 292/1015; Y10T 292/1016; Y10T 292/102; Y10S 292/37; H05K 7/1488
USPC ...... 70/71, 208, 210; 312/265.5, 265.6, 326, 312/329, 222, 332.1
See application file for complete search history.

(56) References Cited

U.S. PATENT DOCUMENTS

| | | | | | |
|---|---|---|---|---|---|
| 6,000,769 | A | * | 12/1999 | Chen | G06F 1/181 |
| | | | | | 220/817 |
| 6,109,710 | A | * | 8/2000 | Wu | G06F 1/181 |
| | | | | | 312/328 |
| 6,157,532 | A | * | 12/2000 | Cook | G06F 1/181 |
| | | | | | 312/265.2 |
| 8,544,967 | B2 | * | 10/2013 | Fan | H05K 7/1488 |
| | | | | | 312/265.4 |
| 10,251,299 | B1 | * | 4/2019 | Wang | E05C 9/026 |
| 2004/0118171 | A1 | * | 6/2004 | Vitry | E05B 83/30 |
| | | | | | 70/208 |
| 2009/0127987 | A1 | * | 5/2009 | Daino | E05B 65/025 |
| | | | | | 312/222 |
| 2012/0293055 | A1 | * | 11/2012 | Qiu | E05C 9/002 |
| | | | | | 49/395 |
| 2014/0001940 | A1 | * | 1/2014 | Chang | G06F 1/181 |
| | | | | | 312/326 |
| 2018/0160562 | A1 | * | 6/2018 | Liu | H05K 7/1487 |

FOREIGN PATENT DOCUMENTS

| | | | |
|---|---|---|---|
| FR | 2582386 | * | 11/1986 |
| TW | 201318530 A | | 5/2012 |

* cited by examiner

DETACHABLE COVER MODULE AND CHASSIS HAVING THE SAME

CROSS-REFERENCE TO RELATED APPLICATION

This non-provisional application claims priority under 35 U.S.C. § 119(a) to Patent Application No. 202010723301.2 filed in China, P.R.C. on Jul. 24, 2020, the entire contents of which are hereby incorporated by reference.

BACKGROUND

Technical Field

A detachable cover module is provided, and in particular, to a bezel suitable for a chassis.

Related Art

A test device or a network device is usually placed in a chassis, and the chassis has a bezel that is pivoted on the chassis to open or close an opening of the chassis. When a user wants to use the device in the chassis, the bezel will be opened and the user can operate the device. The user usually closes the bezel after using the device. When the bezel is closed, the bezel needs to be maintained in the closed state and should not be opened in a situation unexpected by the user. Secondly, when the user wants to open the bezel again, the design of the bezel and the chassis should be easy to operate.

In addition, for an important device, the user needs to lock the bezel when the bezel is closed.

SUMMARY

In view of this, according to some embodiments, a detachable cover module includes a bezel body, a button, and a sliding member. One end of the button is pivotally connected to the bezel body, and the button includes a pushing member. The sliding member includes a connecting portion and a guiding element, when the button is pressed in a first direction, the pushing member pushing the guiding element, so that the connecting portion of the sliding member moves in a second direction from a position protruding outward from the bezel body toward a position not protruding outward from the bezel body, where an included angle is formed between the first direction and the second direction in which the connecting portion moves.

In some embodiments, the detachable cover module further includes a first elastic member and a second elastic member. The button pivots between a first position and a second position. The first elastic member has a force that normally pushes the sliding member toward a protruding position. The second elastic member has a force that normally pushes the button toward the first position.

In some embodiments, the sliding member has a rod portion. The guiding element is fixed to the rod portion and has a guiding surface. When the button is pressed, the pushing member pushes the guiding surface.

In some embodiments, the guiding element includes a hollow portion. The pushing member penetrates into the hollow portion and is configured to slide along the guiding surface.

In some embodiments, the connecting portion has a tongue body, a side convex portion, and an inner convex portion. The side convex portion protrudes outward from the tongue body toward a protruding position. The inner convex portion protrudes outward from the tongue body toward a closing direction of the bezel body.

In some embodiments, the sliding member has a plurality of the connecting portions. The plurality of the connecting portions is an inner tongue and at least one side tongue. The inner tongue has a tongue body and an inner convex portion. The inner convex portion protrudes outward from the tongue body toward a closing direction of the bezel body. Each of the at least one side tongue has a tongue body and a side convex portion. Each of the side convex portions protrudes outward from the tongue body toward a protruding position.

In some embodiments, the detachable cover module further includes a friction member in contact with the sliding member. The friction member is configured to generate a friction force when the sliding member moves.

In some embodiments, the bezel body has a multi-section positioning portion configured to fix the friction member to a plurality of sections. When the friction member is selectively located on the plurality of sections, different friction forces are generated between the friction member and the sliding member.

In some embodiments, the friction member has a plurality of contact surfaces, and the bezel body has a positioning portion. Friction coefficients of the contact surfaces substantially differ from each other. When the friction member is located at the positioning portion, one of the contact surfaces is selectively in contact with the sliding member.

In some embodiments, the detachable cover module further includes a lock, a blocking rod, and a third elastic member. The lock includes a tongue selectively located at a locked position and an unlocked position. The blocking rod is slidably disposed on the bezel body to move between a blocking position and a non-blocking position. The blocking rod has a blocking tongue. When the tongue moves from an unlocked position to a locked position, the tongue pushes the blocking rod to move toward the blocking position. When the blocking rod is located at the blocking position, the blocking tongue prevents the connecting portion of the sliding member from moving toward the position that does not protrude outward from the bezel body. The third elastic member has a force that normally pushes the blocking rod toward the non-blocking position.

In some embodiments, the blocking rod has a blocking portion. When the blocking rod is located at the blocking position, the blocking portion prevents the button from pivoting as a result of being pressed.

In some embodiments, the blocking rod has a state element. The bezel body has a window corresponding to the state element. A visible state presented by the state element through the window when the blocking rod is located at the blocking position is different from a visible state presented by the state element through the window when the blocking rod is located at the non-blocking position.

According to some embodiments, a chassis includes a chassis body and a detachable cover module. The chassis body has a pivot column and a closed column. There is an opening between the pivot column and the closed column. The closed column has a latch portion. One side of the detachable cover module is pivotally disposed on the pivot column so that the detachable cover module pivots between an open position and a closed position. The detachable cover module includes a bezel body, a button, and a sliding member. One end of the button is pivotally connected to the bezel body, and the button has a pushing member. The sliding member includes a connecting portion and a guiding element. When the button is pressed in a first direction, the pushing member pushes the guiding element, so that the connecting portion of the sliding member moves in a second direction from a position protruding outward from the bezel body toward a position not protruding outward from the bezel body. An included angle is formed between the first direction and the second direction in which the connecting portion moves. When the detachable cover module is located at the closed position and the connecting portion protrudes outward from the bezel body, the connecting portion is located on the latch portion.

In some embodiments, the chassis body has a blocking rib located at the closed column. The detachable cover module includes a friction member and a pre-force element. The friction member is in contact with the sliding member and configured to generate a friction force when the sliding member moves. When the detachable cover module is located at the closed position, the pre-force element pushes the blocking rib and has a force that normally pushes the detachable cover module away from the closed position.

In some embodiments, the latch portion is a convex hull that protrudes from the closed column toward the pivot column. The connecting portion has a tongue body and an inner convex portion. The inner convex portion protrudes outward from the bezel body toward an opening direction from the tongue body. When the detachable cover module pivots toward the closed position and approaches the closed column, the convex hull pushes the inner convex portion to move the sliding member toward the bezel body. When the detachable cover module is located at the closed position and the button is not pressed, the inner convex portion is engaged with the convex hull.

In some embodiments, the closed column includes a plurality of the latch portions. The plurality of the latch portions is a convex hull and at least one engagement hole. The convex hull protrudes from the closed column toward the pivot column. The sliding member has a plurality of the connecting portions. The plurality of the connecting portions is an inner tongue and at least one side tongue. The inner tongue has a tongue body and an inner convex portion. The inner convex portion protrudes outward from the bezel body toward the opening direction from the tongue body. Each of the at least one side tongue has a tongue body and a side convex portion. Each of the side convex portions protrudes outward from the tongue body toward a protruding position. When the detachable cover module pivots toward the closed position and approaches the closed column, the convex hull pushes the inner convex portion to move the sliding member toward the bezel body and the at least one side convex portion is in no contact with the closed column. When the detachable cover module is located at the closed position and the button is not pressed, the inner convex portion is engaged with the convex hull, and the side convex portion is located in the engagement hole.

Based on the above, a detachable cover module and a chassis having the detachable cover module are provided. The detachable cover module may be matched with the chassis body shown in FIG. 1, or may be matched with other chassis bodies. According to some embodiments, when the button of the detachable cover module is pressed, the pushing member of the button pushes the guiding element of the sliding member, so that the connecting portion of the sliding member retracts from the position (that is, the position at which the sliding member retracts) protruding outward from the bezel body. According to some embodiments, the body of the chassis has a latch portion. When the detachable cover module is at the closed position, the connecting portion is located at the latch portion, so that the detachable cover module covers the opening of the chassis body.

BRIEF DESCRIPTION OF THE DRAWINGS

FIG. 10G is a top view of the friction member in FIG. 10F.

12B are each a partial front view of a vicinity of the button in FIG. 1, and FIG. 12C is a cross-sectional view of a position 12C-12C in FIG. 12B.

DETAILED DESCRIPTION

Figure 1:
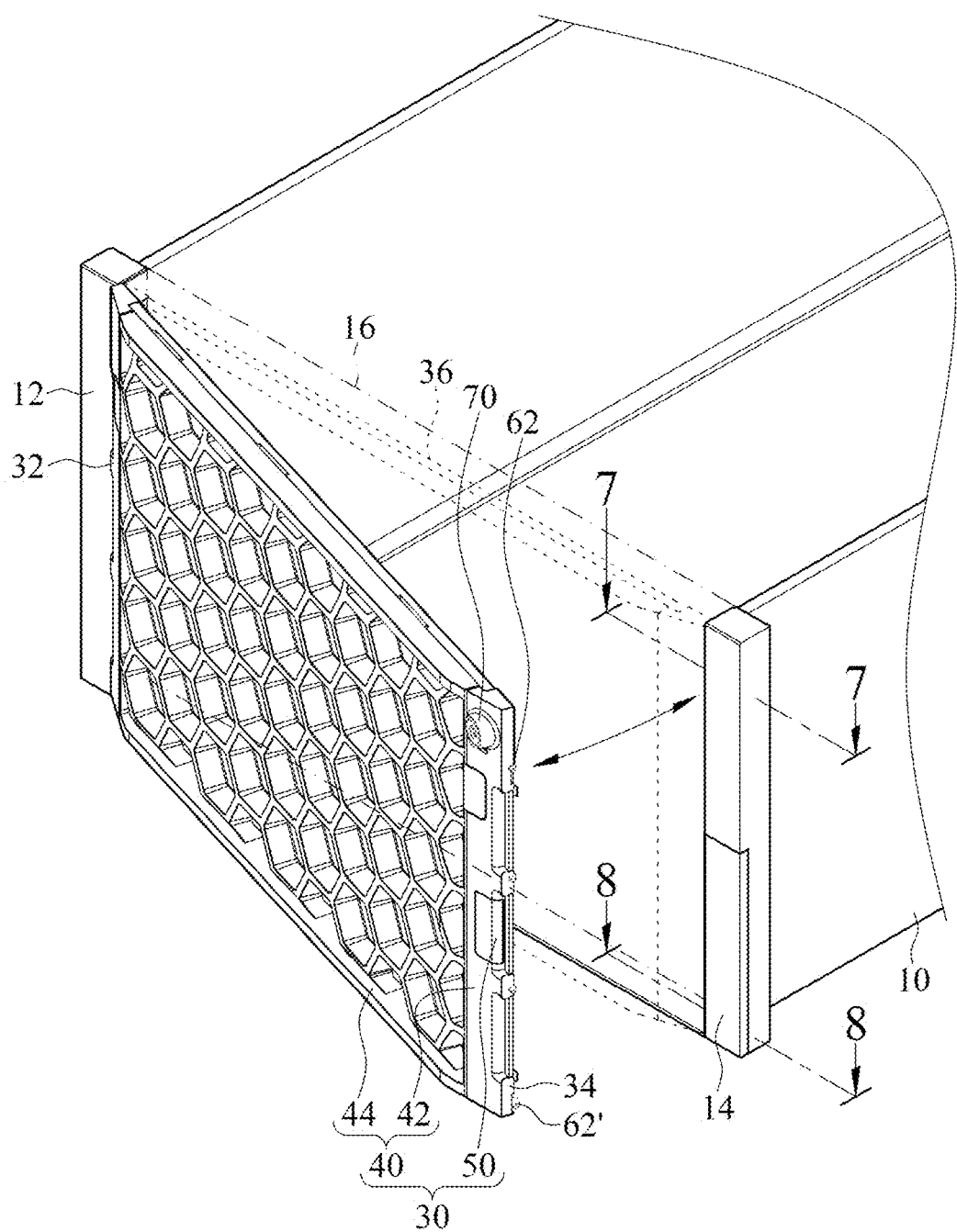
FIG. 1 illustrates a three-dimensional view of a chassis according to some embodiments.
Figure 2:
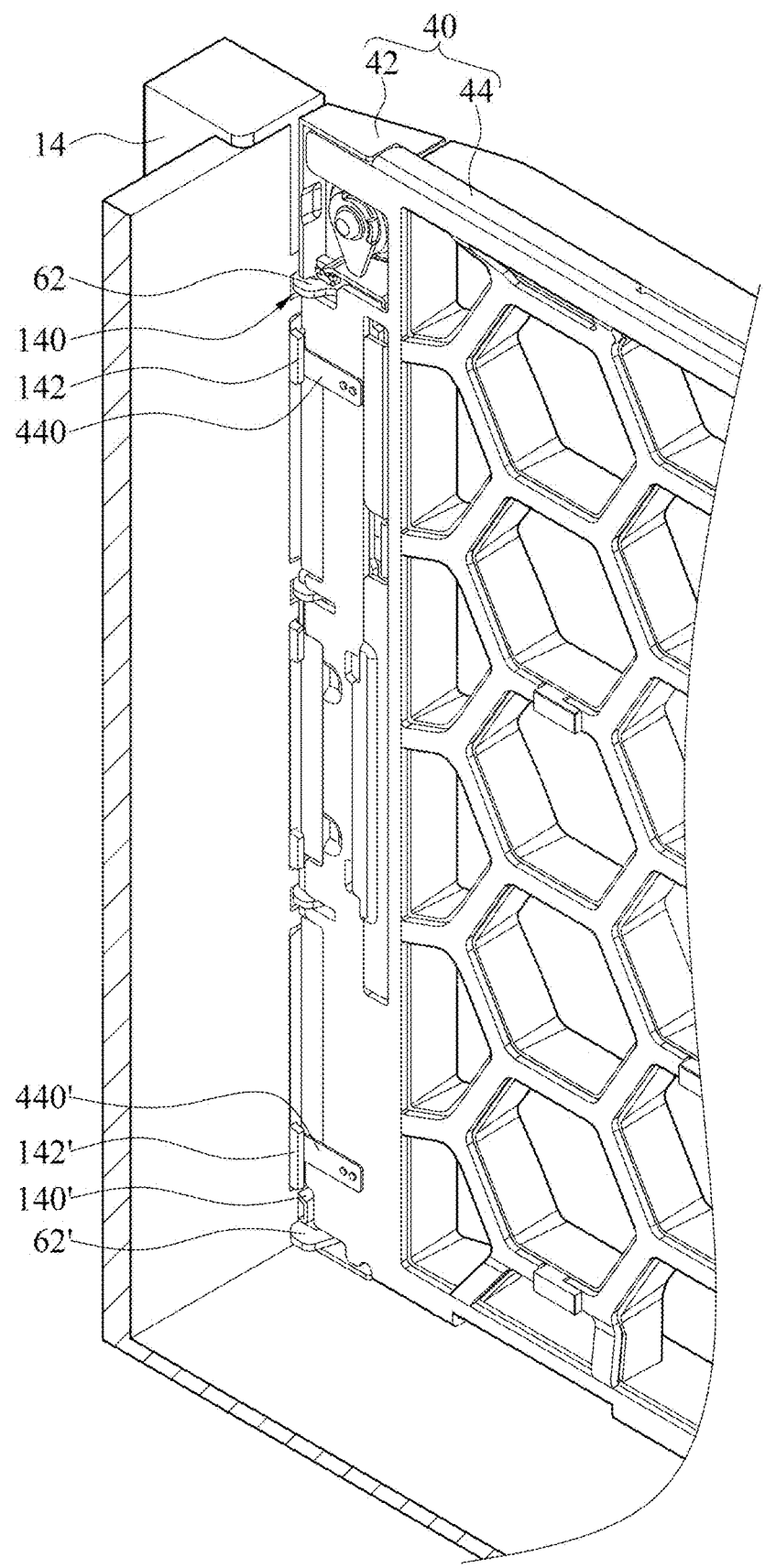
FIG. 2 illustrates a partial three-dimensional view of a chassis from another perspective according to some embodiments.

Referring to FIG. 1 and FIG. 2 together, FIG. 1 illustrates a three-dimensional view of a chassis according to some embodiments. FIG. 2 illustrates a partial three-dimensional view of a chassis from another perspective according to some embodiments. The chassis includes a chassis body 10 and a detachable cover module 30. The chassis body 10 has a pivot column 12 and a closed column 14. There is an opening 16 between the pivot column 12 and the closed column 14, and the closed column 14 has a latch portion 140 (see FIG. 2). One side of the detachable cover module 30 is pivotally disposed on the pivot column 12 to pivot at an open position and a closed position 36 (a position shown by a dashed line in FIG. 1). The side of the detachable cover module 30 pivotally disposed on the pivot column 12 is referred to as a pivot side 32, and one side of the detachable cover module 30 opposite to the pivot side 32 is referred to as a closed side 34. The closed position 36 is the position at which the detachable cover module 30 covers the opening 16, that is, the closed side 34 is located at the position corresponding to the closed column 14 (the position shown in FIG. 2). The detachable cover module 30 pivots around the pivot column 12 and leaves the closed position 36, which is referred to as an open position (for example, the position of the detachable cover module in solid lines in FIG. 1). The open position may be a position (the position of the detachable cover module in solid lines shown in FIG. 1) at which the opening 16 is completely exposed or only a part of the opening 16 is exposed.

The chassis body 10 of the foregoing chassis may be used to place a device, for example, but not limited to a test device, a laboratory device, or a network device. The other side of the chassis body 10 opposite to the detachable cover module 30 may be in a completely unclosed state (a fully open state), as shown in FIG. 1. The other side of the chassis body 10 may be used to provide cables, network cables, or power cables of the device for wiring. In some embodiments, the other side of the chassis body 10 has a backboard having at least one wiring hole thereon for arranging cables, network cables, or power cables of the device. In some embodiments, a plurality of chassis may be stacked (stacked vertically according to FIG. 1), so that space can be used better, and related devices can be placed in a same region.

Figure 3:
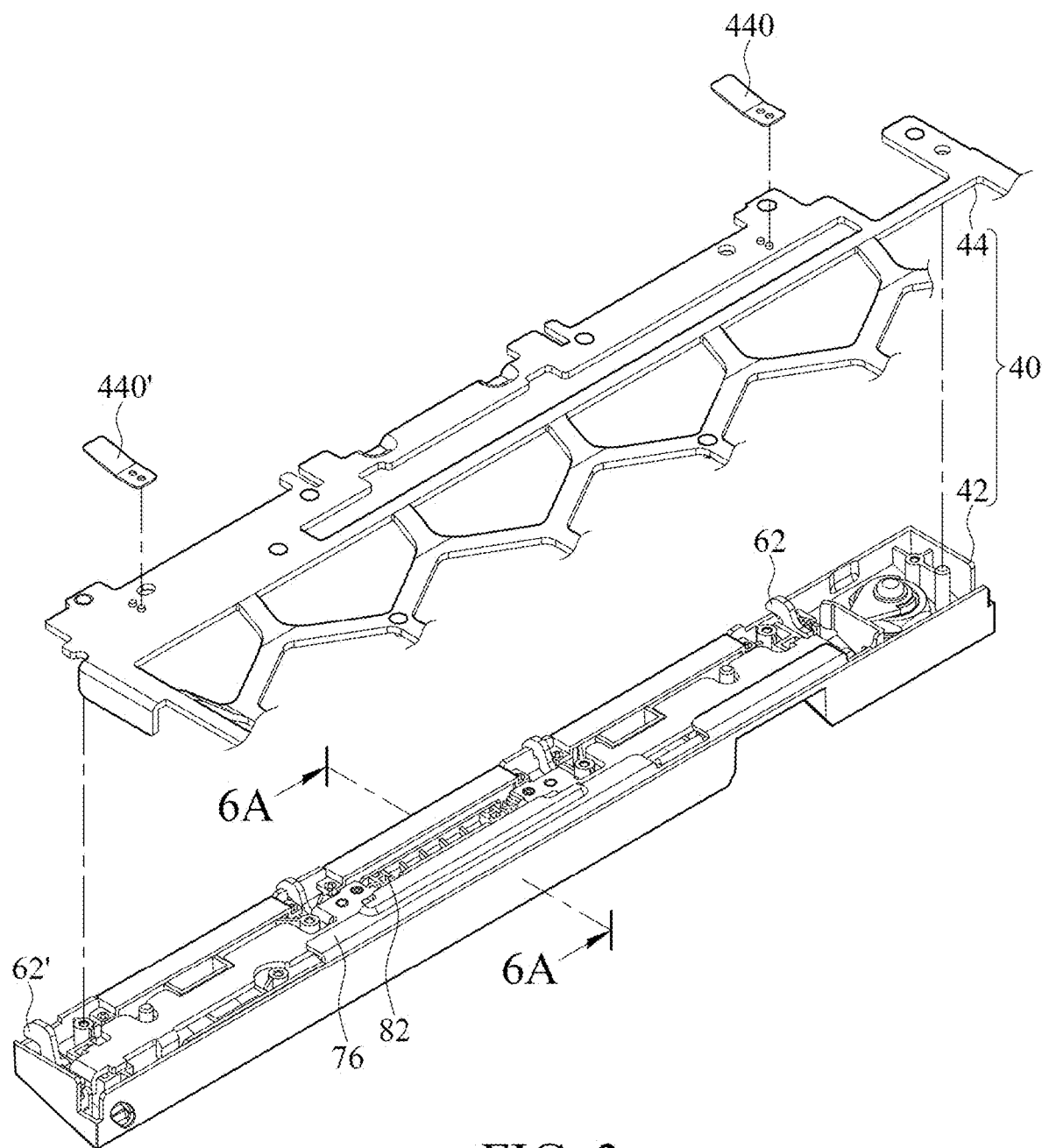
FIG. 3 illustrates a partial three-dimensional exploded view of a detachable cover module according to some embodiments.
Figure 4:
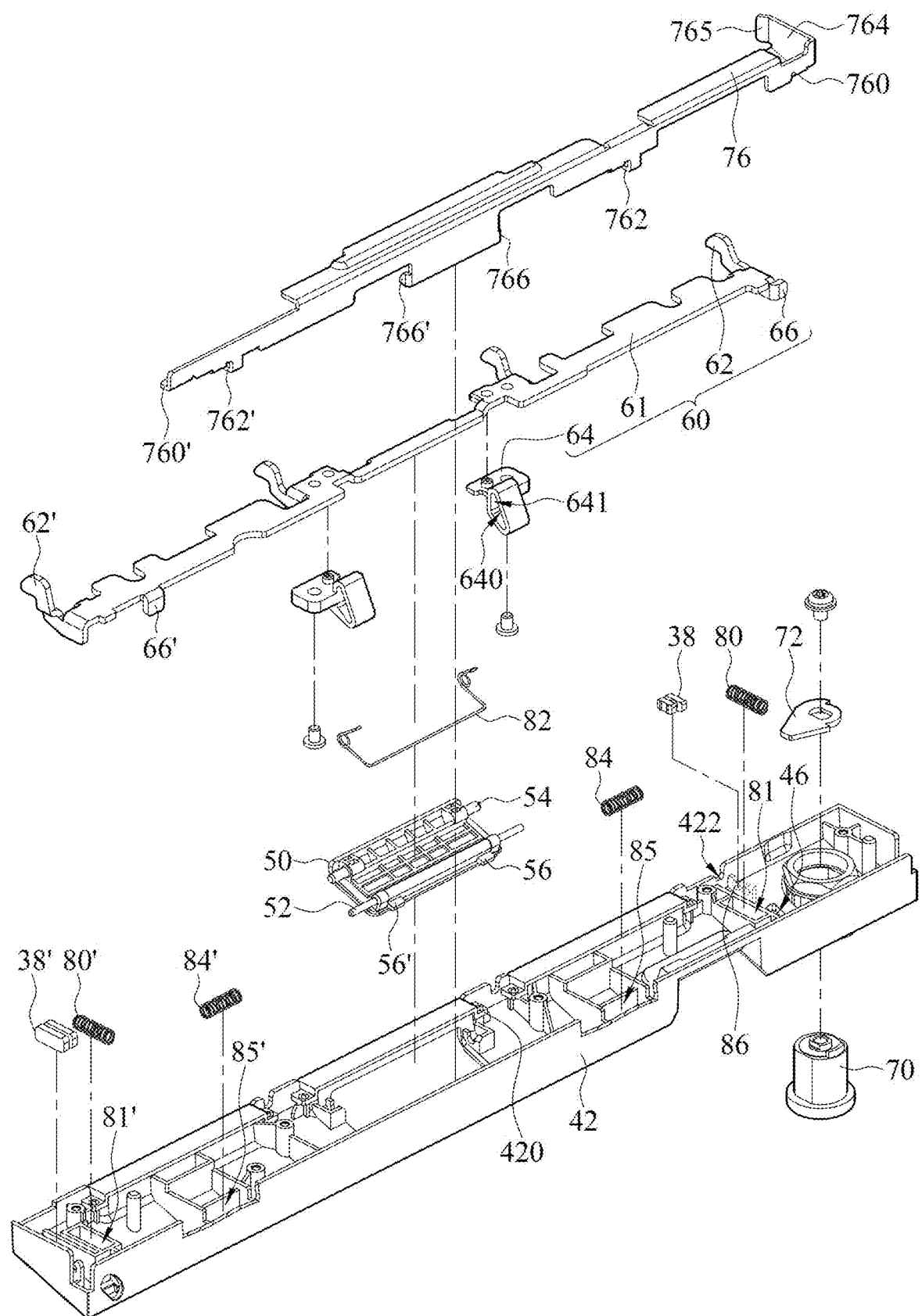
FIG. 4 illustrates a partial three-dimensional exploded view of a detachable cover module according to some embodiments.

Referring to FIG. 3 and FIG. 4 together, FIG. 3 and FIG. 4 illustrate each a three-dimensional exploded view of a part of a detachable cover module according to some embodiments. A detachable cover module 30 includes a bezel body 40, a button 50, and a sliding member 60. One end of the button 50 is pivotally connected to the bezel body 40, and the button includes a pushing member 52. The sliding member 60 includes a connecting portion 62 and a guiding element 64. When the button 50 is pressed in a first direction L1 (as shown in FIG. 6C), the pushing member 52 pushes the guiding element 64, so that the connecting portion 62 of the sliding member 60 moves from a position protruding outward from the bezel body 40 toward a position not protruding outward from the bezel body 40 (which are described in detail later in some embodiments). An included angle θ (referring to FIG. 6C) is formed between the first direction and a direction in which the connecting portion moves.

Referring to FIG. 3 and FIG. 4 together, FIG. 3 and FIG. 4 illustrate each a three-dimensional exploded view of a part of a detachable cover module according to some embodiments. A detachable cover module 30 includes a bezel body 40, a button 50, a sliding member 60, and a first elastic member 80. In these embodiments, one end of the button 50 is pivotally connected to the bezel body 40 and pivots between a first position and a second position (described in detail later). The button 50 has a pushing member 52. The sliding member 60 includes a connecting portion 62 and a guiding element 64. When the button 50 is pressed and pivots toward the second position, the pushing member 52 pushes the guiding element 64, so that the connecting portion 62 of the sliding member 60 moves from a position protruding outward from the bezel body 40 toward a position not protruding outward from the bezel body 40, that is, the sliding member 60 moves from a protruding position toward a retracted position (described in detail later). When the sliding member 60 is located at the retracted position, the connecting portion 62 does not protrude from the bezel body 40, as shown in FIG. 6B. When the sliding member 60 is located at the protruding position, the connecting portion 62 protrudes from the bezel body 40, as shown in FIG. 6C. An included angle θ is formed between a second direction L2 in which the connecting portion 62 moves and the first direction L1. In some embodiments, the included angle θ is greater than 10 degrees (as shown in FIG. 6C, which will be described later). When the detachable cover module 30 is located at a closed position 36 and the connecting portion 62 protrudes from the body 40, the connecting portion 62 is located at a latch portion 140 (as shown in FIG. 2). The first elastic member 80 has a force that normally pushes the sliding member 60 toward a protruding position (which will be described later).

Through the above structure, when the button 50 is pressed and pivots toward the second position, the pushing member 52 of the button 50 pushes the guiding element 64 of the sliding member 60, so that the sliding member 60 moves toward the retracted position and the connecting portion 62 is separated from the latch portion 140. Therefore, the detachable cover module 30 can be opened. In the foregoing embodiment, the pushing member 52 pushes the guiding element 64 to make the connecting portion 62 separate from the latch portion 140. Therefore, the guiding element 64 and the connecting portion 62 may be relatively stationary, or the guiding element 64 and the connecting portion 62 may move, swing, or rotate relative to each other, but a connection relationship can still be achieved. The pushing member 52 pushes the guiding element 64, so that the connecting portion 62 is separated from the latch portion 140.

Figure 5:
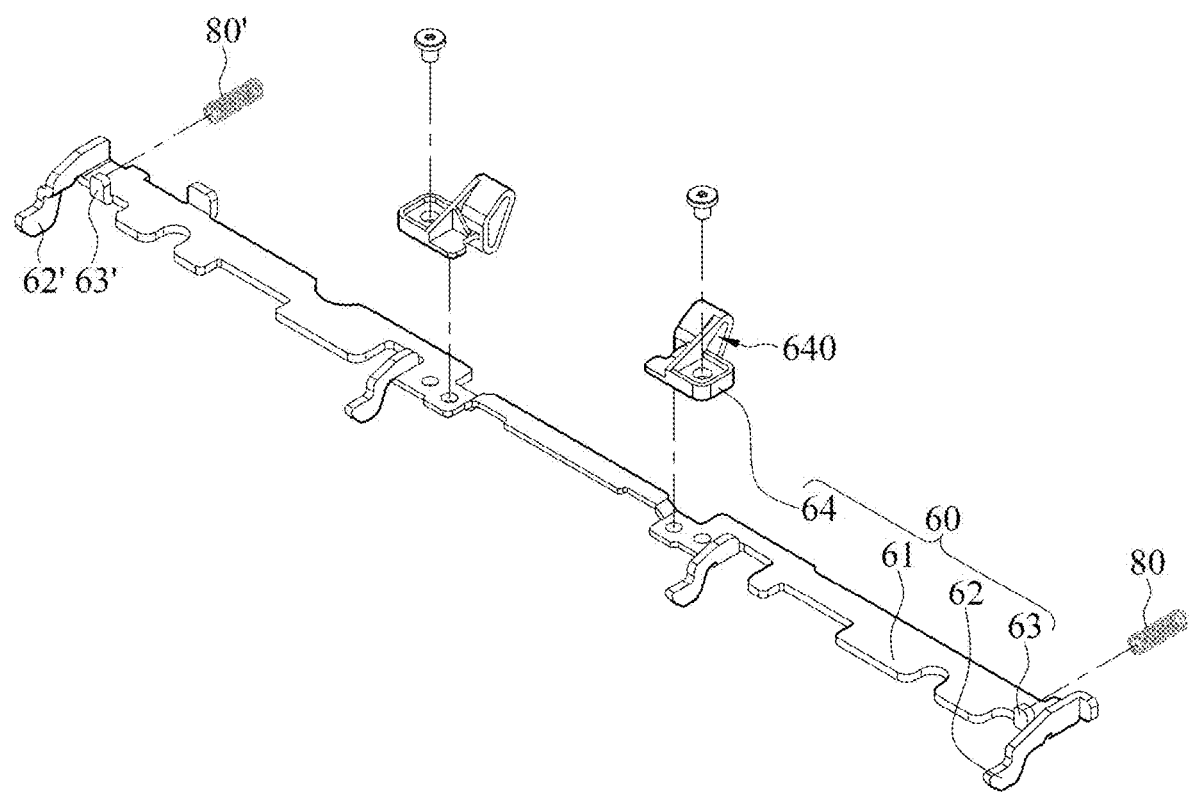
FIG. 5 illustrates a three-dimensional exploded view of a sliding member according to some embodiments.

In some embodiments, the connecting portion 62 and the guiding element 64 are relatively stationary. Referring to FIG. 5, FIG. 5 illustrates a three-dimensional exploded view of a sliding member 60 according to some embodiments. The sliding member 60 includes a connecting portion 62, a rod portion 61, and a guiding element 64. The connecting portion 62 extends in a direction of protruding outward from a bezel body 40 from the rod portion 61, which means that the connecting portion 62 protrudes from the rod portion 61. In some embodiments, as shown in FIG. 2, the detachable cover module 30 is located at a closed position 36, and the connecting portion 62 extends toward a closed column 14 from the rod portion 61. In some embodiments, the connecting portion 62 extends toward the closed position 36 (see FIG. 1). The guiding element 64 and the rod portion 61 are separate elements, and the guiding element 64 is fixed to the rod portion 61. Therefore, the connecting portion 62 and the guiding element 64 are relatively stationary. In some embodiments, the connecting portion 62, the rod portion 61, and the guiding element 64 are integrated into one element, which means that the sliding element 60 is a single element.

In some embodiments, the sliding member 60 includes two guiding elements 64 (see FIG. 4), and the button 50 includes two pushing members (see FIG. 4). When the button 50 is pressed and pivots toward a second position, the two pushing members 52 of the button 50 pushes the two guiding elements 64 of the sliding member 60, so that the sliding member 60 moves toward a retracted position and the connecting portion 62 is separated from the latch portion 140. The two pushing members 52 are used to push the two guiding elements 64, so that the sliding member can be more stable when moving toward the retracted position.

Figure 6A:
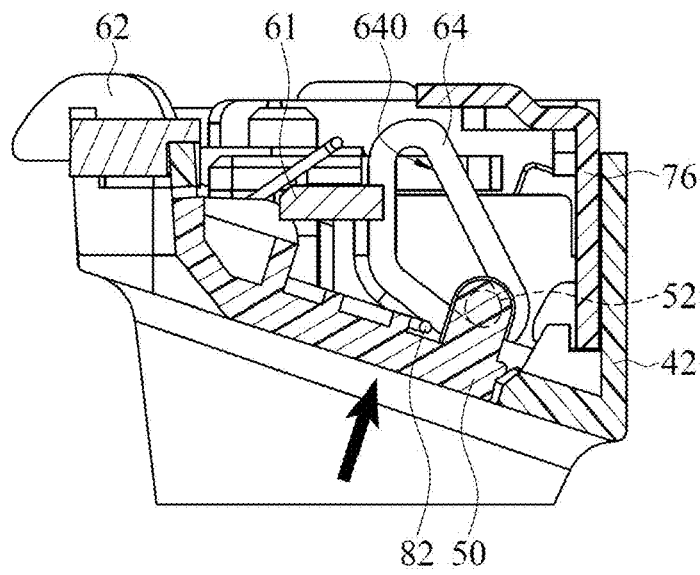
FIG. 6A illustrates a cross-sectional view of a position 6A-6A in FIG. 3, showing a state that a sliding member is located at a protruding position.
Figure 6B:
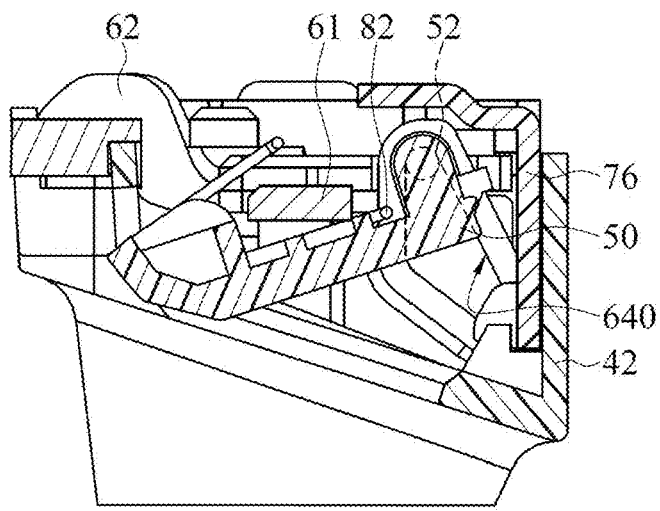
FIG. 6B illustrates a cross-sectional view of a position in FIG. 6A, showing a state that a sliding member is located at a retracted position.
Figure 6C:
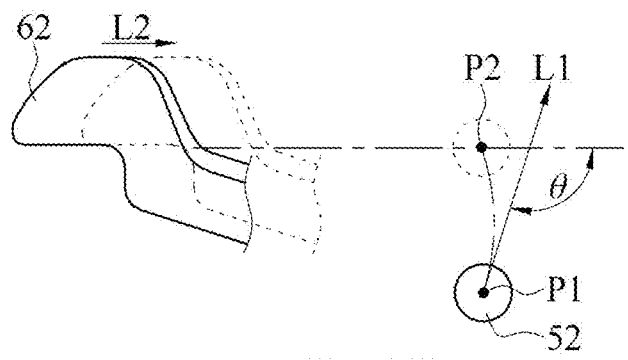
FIG. 6C illustrates a schematic diagram of an included angle between a direction in which a button is pressed and a direction in which a connecting portion of a sliding member moves in FIG. 6A and FIG. 6B.

For a linkage relationship between the button 50 and the sliding member 60, reference is made to FIG. 6A and FIG. 6B. FIG. 6A illustrates a cross-sectional view of a position 6A-6A in FIG. 3, showing a state that a sliding member 60 is located at a protruding position. FIG. 6B illustrates a cross-sectional view of a position in FIG. 6A, showing a state that a sliding member 60 is located at a retracted position. As described above, one end of the button 50 is pivotally connected to the bezel body 40 and pivots between a first position and a second position. The first position of the button 50 is the position at which the button 50 is located in FIG. 6A, and the second position of the button 50 is the position at which the button 50 is located in FIG. 6B. When a user presses the button 50 to pivot the button 50 toward the second position, the pushing member 52 pushes the guiding element 64 and drives the sliding member 60, so that the sliding member 60 moves from the protruding position (as shown in FIG. 6A) to the retracted position (as shown in FIG. 6B), that is, the connecting portion 62 moves from the position protruding outward from the bezel body 40 to the position (at which the connecting portion 62 does not protrude outward from the bezel body 40) retracting into the bezel body 40. Accordingly, the connecting portion 62 is separated from the latch portion 140 (see FIG. 2), so that the detachable cover module 30 can pivot toward the open position (the solid line detachable cover module position in FIG. 1 is one of the open positions).

Referring to FIG. 6C, FIG. 6C illustrates a schematic diagram of an included angle between the first direction L1 in which a button 50 is pressed and the second direction L2 in which a connecting portion 62 moves in FIG. 6A and FIG. 6B. As described above, one end of the button 50 is pivotally connected to the bezel body 40, and the other end (referred to as a free end below) of the button 50 pivots about a pivot. In the embodiment of FIG. 6A, the pushing member 52 is a cylinder, and in FIG. 6C, the first direction L1 is described as a normal line on a surface of the button 50, for example. Referring to FIG. 6C, the solid line in FIG. 6C indicates the position of the pushing member 52 and the connecting portion 62 when the button 50 is at the first position, where a center (a predetermined point) of the pushing member 52 is marked with P1. The dashed line in FIG. 6C indicates the position of the pushing member 52 and the connecting portion 62 when the button 50 is at the second position, where a center (a predetermined point) of the pushing member 52 is marked with P2 when the button 50 is at the second position. The moving direction L2 (the second direction L2) is the direction from the protruding position of the sliding member 60 to the retracted position, that is, the direction in which the connecting portion 62 moves. It can be seen from FIG. 6C that the included angle θ between the first direction L1 and the moving direction L2 (the second direction L2) is greater than 10 degrees.

A magnitude of the included angle θ is related to a ratio of a distance by which the button 50 is pressed and a distance by which the connecting portion 62 moves. The included angle θ of FIG. 6C is used as an example. Assuming that the distance by which the connecting portion 62 moves is constant (that is, the distance by which the latch portion 140 is completely separated), a smaller included angle θ leads to a shorter distance (that is, the distance from P1 to P2 is shorter) by which the button 50 is pressed, but a force (which is a force that prevents the first elastic member 80 from normally pushing the sliding member 60 toward the protruding position) applied to the button 50 needs to be larger. On the contrary, a larger included angle θ leads to a longer distance by which the button 50 is pressed and a smaller force applied to the button 50. Therefore, a value of the included angle θ may be adjusted according to requirements of the designer.

In some embodiments, the guiding element 64 has a guiding surface 640 (as shown in FIG. 4 and FIG. 6A). When the button 50 pivots toward the second position, the pushing member 52 pushes the guiding surface 640, so that the guiding element 64 moves toward the retracted position (that is, toward the right in FIG. 6A), and the connecting portion 62 also moves toward the direction in which the latch portion 140 is separated. In this embodiment, the guiding element 64 includes a hollow portion 641. The pushing member 52 penetrates into the hollow portion 641 and is configured to slide along the guiding surface 640. In some embodiments, the guiding surface 640 is an inner side surface of the guiding element 64.

In some embodiments, the bezel body 40 includes a side plate 42 and a sheet body 44. In the embodiments of FIG. 3 and FIG. 4, the side plate 42 and the sheet body 44 are two separate elements. In some embodiments, the side plate 42 and the sheet body 44 are a one-piece element. In some embodiments, the sheet body 44 is a hollow structure. As shown in FIG. 1, the hollow structure facilitates heat dissipation of a device placed inside the chassis, and also facilitates observation of an operating state of the device from outside by a user.

In some embodiments, referring to FIG. 4, the button 50 has a pivot 54, and the bezel body 40 has a shaft seat 420. Therefore, when the user presses the button 50, the button 50 pivots around the pivot 54. In the embodiment of FIG. 4, the shaft seat 420 is located on the side plate 42.

As described above, the first elastic member 80 has the force that normally pushes the sliding member 60 toward the protruding position. Therefore, when the user releases the button 50 (that is, no longer presses the button 50), the first elastic member 80 will push the sliding member 60 toward the protruding position, so that the connecting portion 62 protrudes outward from the bezel body 40. In this case, the button 50 returns to the first position driven by the sliding member 60. In some embodiments, two ends of the first elastic member 80 are respectively in contact with the sliding member 60 and the bezel body 40, so that the first elastic member 80 has the force that normally pushes the sliding member 60 toward the protruding position.

In some embodiments, the button 50 has a limiting member 56 located at the free end of the button 50. When the button 50 pivots to the first position, the limiting member 56 is in contact with the side plate 42 to prevent the button 50 from protruding from the surface of the side plate 42, thereby ensuring that the surface of the button 50 is flush with the surface of the side plate 42. In some embodiments, the button 50 has a plurality of limiting members 56, 56', which are separately disposed at the free end of the button 50. When the first elastic member 80 slides and drives the button 50 to reset to the first position, the limiting members 56, 56' can align the surface of the button 50 with the surface of the side plate 42 more stably.

In some embodiments, the first elastic member 80 is a compression spring, as shown in FIG. 4. There may be one or more first elastic members 80. In an embodiment in which there is one first elastic member 80, the position of the first elastic member 80 is determined as a good position that can push the sliding member 60 more stably, for example, a middle section of the rod portion 61 of the sliding member 60 in FIG. 4, which is not limited thereto. In some embodiments, the detachable cover module 30 includes a plurality of first elastic members 80, 80', as shown in FIG. 4. In the embodiment of FIG. 4, the sliding member 60 is rod-shaped, and in order to make the two first elastic members 80, 80' push the sliding member 60 more stably, the two first elastic members 80, 80' are disposed at a symmetrical position of the rod portion 61 in a long axial direction.

As described above, the two ends of the first elastic member 80 are respectively in contact with the sliding member 60 and the bezel body 40. In some embodiments, referring to FIG. 4 and FIG. 5, the side plate 42 of the bezel body 40 has first grooves 81, 81' for respectively accommodating the two first elastic members 80, 80'. The sliding member 60 has lug portions 63, 63' corresponding to the first elastic members 80, 80', and two ends of the first elastic member 80, 80' are respectively in contact with the lug portions 63, 63' and the first grooves 81, 81'. Therefore, the first elastic members 80, 80' has a force that normally pushes the sliding member 60 toward a protruding position (that is, toward the bottom left of FIG. 5).

There may be one or more connecting portions 62 of the sliding members 60. In some embodiments, there are four connecting portions 62, as shown in FIG. 4. In some embodiments, the side plate 42 has a guide groove 422 configured to guide the sliding member to move between the protruding position and the retracted position. A number of the guide grooves 422 corresponds to a number of connecting portions 62.

In some embodiments, the detachable cover module 30 includes a second elastic member 82 (see FIG. 4), the second elastic member 82 having a force that normally pushes the button 50 toward a first position. In the embodiment of FIG. 4, the second elastic member 82 is a torsion spring, two ends of the torsion spring respectively pushing the button 50 and the bezel body 40. Therefore, the torsion spring has a force that normally pushes the button 50 toward the first position. When the user releases the button 50 from the second position, the torsion spring restores the button 50 to the first position. Therefore, the second elastic member 82 increases the force that restores the button 50 to the first position. In addition, the second elastic member 82 aligns the surface of the button 50 with the surface of the side plate 42 (see FIG. 1).

Furthermore, the two ends of the second elastic member 82 are respectively in contact with the button 50 and the bezel body 40. One end of the second elastic member 82 may be, but is not limited to being in contact with the side plate 42 or the sheet body 44 of the bezel body 40. FIG. 3 is used as an example. The two ends of the second elastic member 82 are respectively in contact with the button 50 and the sheet body 44.

Figure 7A:
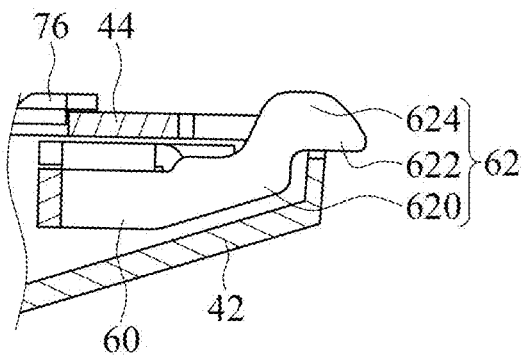
FIG. 7A illustrates a partial cross-sectional view of a position 7-7 in FIG. 1 according to some embodiments.

Referring to FIG. 7A, FIG. 7A illustrates a partial cross-sectional view of a position 7-7 in FIG. 1 according to some embodiments, showing an embodiment of a connecting portion 62. In some embodiments, the connecting portion 62 has a tongue body 620, a side convex portion 622, and an inner convex portion 624. The side convex portion 622 protrudes outward from the tongue body 620 toward a protruding position (that is, a direction on the right side of FIG. 7A) from the tongue body 620. Specifically, the side convex portion 622 is a part of the connecting portion 62 protruding outward from a side surface (that is, a right side surface of the side plate 42 shown in FIG. 7A) of the bezel body 40 when the sliding member 60 is located at the protruding position. The inner convex portion 624 protrudes outward from the tongue body 620 toward a closed position (that is, an upper direction in FIG. 7A, also referred to as an opening direction 16 toward a chassis body 10) of the bezel body 40 from the tongue body 620. Specifically, the inner convex portion 624 is a part of the connecting portion 62 protruding outward from an inner side surface (that is, an upper side surface of the side plate 42 in FIG. 7A) of the bezel body 40.

Figure 7B:
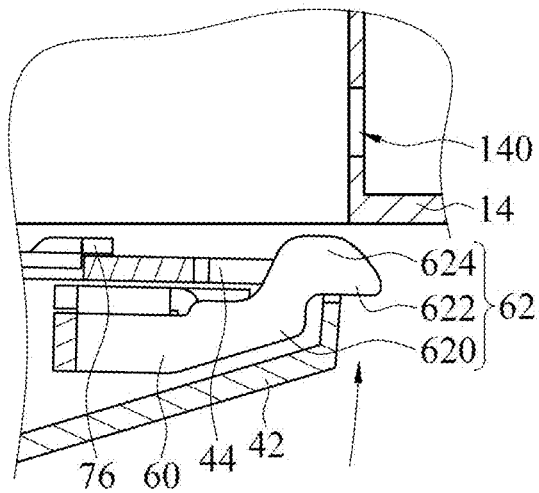
FIG. 7B, FIG. 7C, and FIG. 7D illustrate each a schematic diagram of an action of a connecting portion of FIG. 7A when a detachable cover module pivots toward a closed position.
Figure 7C:
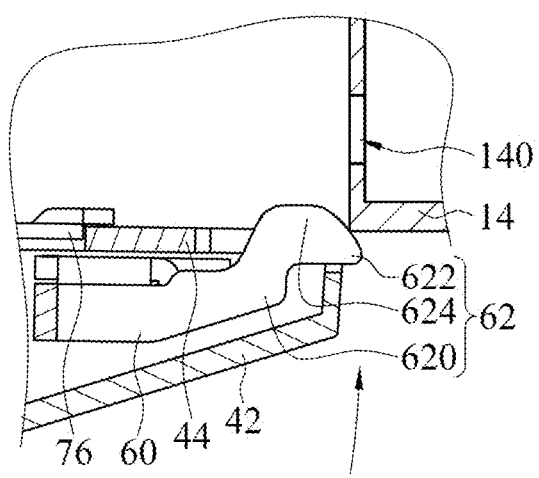
Figure 7D:
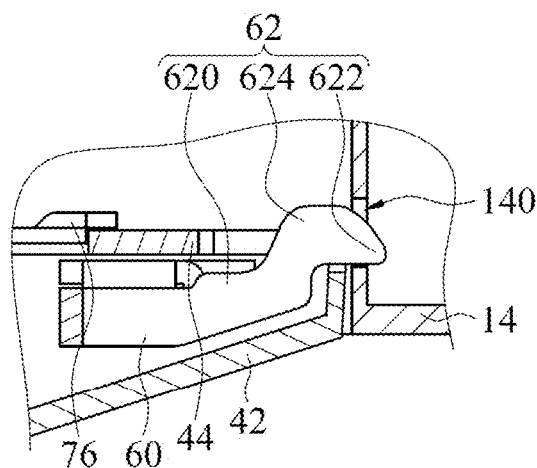

Still referring to FIG. 7B to FIG. 7D in sequence, FIG. 7B to FIG. 7D each illustrate a schematic diagram of an action of a connecting portion of FIG. 7A when a detachable cover module pivots toward a closed position 36. In the embodiment of the connecting portion in FIG. 7A, the latch portion 140 is an engagement hole. An upper part of FIG. 2 is a three-dimensional view of a latch portion 140 and a connecting portion 62 of this embodiment. It can be seen from FIG. 7B that when the detachable cover module 30 pivots toward the closed position 36 and approaches the closed column 14, the inner convex portion 624 of the connecting portion 62 is first in contact with the closed column 14. It can be seen from the figure, the inner convex portion 624 has a guiding surface, the guiding surface being used to alleviate the contact between the connecting portion 62 and the closed column 14 and guide the sliding member 60 to move toward the retracted position when the detachable cover module 30 continually pivots toward the closed position 36. The guiding surface of the inner convex portion 624 may be, but is not limited to, a guiding surface or a curved surface. The guiding surface of the inner convex portion 624 in FIG. 7A is a curved surface. It can be seen from FIG. 7B to FIG. 7D that, guided by the inner convex portion 624, when the detachable cover module 30 is located at the closed position 36, the side convex portion 622 is located in the engagement hole and maintains the detachable cover module 30 at the closed position 36. The guiding surface of the inner convex portion 624 can prevent the surface of the closed column 14 from being worn or scratched due to repeated exposing and covering of the detachable cover module 30.

Figure 8A:
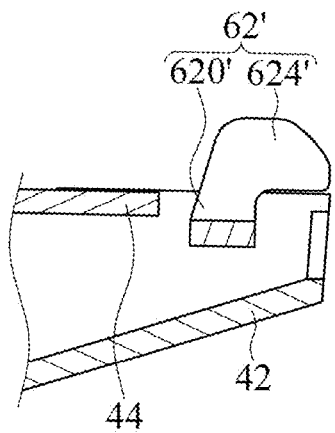
FIG. 8A illustrates a partial cross-sectional view of a position 8-8 in FIG. 1 according to some embodiments.

Referring to FIG. 8A, FIG. 8A illustrates a partial cross-sectional view of a position 8-8 in FIG. 1 according to some embodiments, showing an embodiment of a connecting portion 62'. In some embodiments, the connecting portion 62' has a tongue body 620' and an inner convex portion 624'. The inner convex portion 624' protrudes outward from the tongue body 620' toward a closed position (that is, an upper direction in FIG. 8A) of the bezel body 40 from the tongue body 620'. Specifically, the inner convex portion 624' is a part of the connecting portion 62' protruding outward from an inner side surface (that is, an upper side surface of the side plate 42 in FIG. 8A) of the bezel body 40.

Figure 8B:
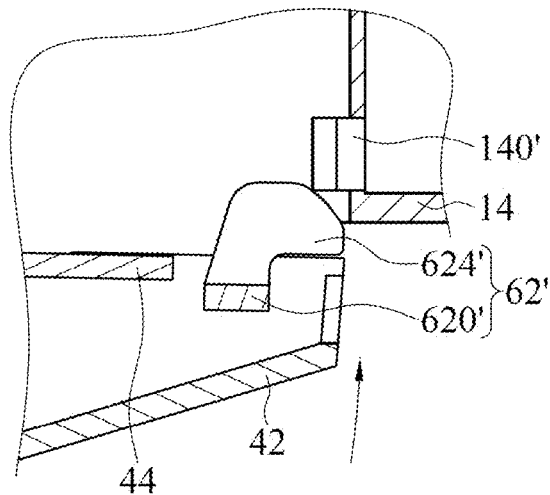
FIG. 8B, FIG. 8C, and FIG. 8D illustrate each a schematic diagram of an action of a connecting portion of FIG. 8A when a detachable cover module pivots toward a closed position.
Figure 8C:
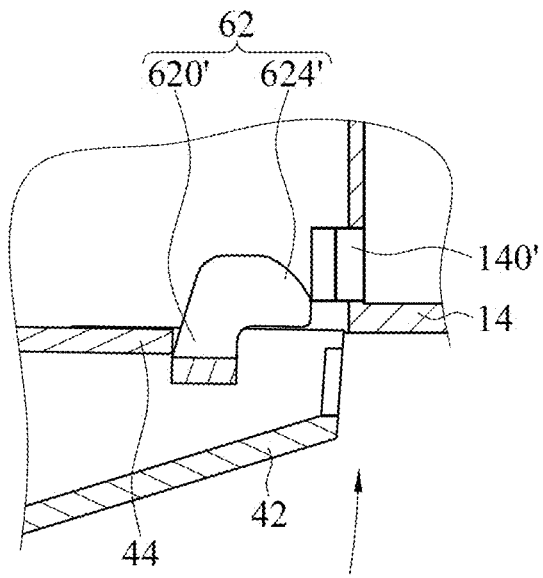
Figure 8D:
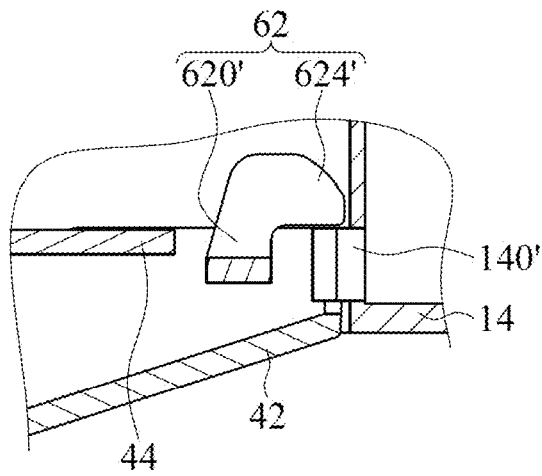

Still referring to FIG. 8B to FIG. 8D in sequence, FIG. 8B to FIG. 8D illustrate each a schematic diagram of an action of a connecting portion of FIG. 8A when a detachable cover module pivots toward a closed position 36. In the embodiment of the connecting portion 62' in FIG. 8A, a latch portion 140 is a convex hull (an element marked with 140' in the figure). The convex hull 140' protrudes toward a pivot column from the closed column 14. A lower part of FIG. 2 is a three-dimensional view of a latch portion 140' and a connecting portion 62' of this embodiment. It can be seen from FIG. 8B that when the detachable cover module 30 pivots toward the closed position 36 and approaches the closed column 14, the inner convex portion 624' of the connecting portion 62' is first in contact with the convex hull 140'. It can be seen from the figure, the inner convex portion 624' has a guiding surface, the guiding surface being used to alleviate the contact between the connecting portion 62' and the convex hull 140' and guide the sliding member 60 to move toward the retracted position when the detachable cover module 30 continually pivots toward the closed position 36. The guiding surface of the inner convex portion 624' may be, but is not limited to, a guiding surface or a curved surface. The guiding surface of the inner convex portion 624' in FIG. 8A is a curved surface. It can be seen from FIG. 8B to FIG. 8D that, guided by the inner convex portion 624', when the detachable cover module 30 is located at the closed position 36, the inner convex portion 624' is engaged with the convex hull 140' and maintains the detachable cover module 30 at the closed position 36. In this embodiment, through the design of the inner convex portion 624' and the convex hull 140', the surface of the closed column 14 can be prevented from being worn or scratched due to the repeated opening and closing of the detachable cover module 30.

In some embodiments, the sliding member 60 has a plurality of connecting portions 62 shown in FIG. 7A, which are scattered at different positions of the rod portion 61 of the sliding member 60. When the detachable cover module 30 is located at the closed position 36, the connecting portions 62 may maintain the detachable cover module 30 at the closed position 36 better. Similarly, in some embodiments, the sliding member 60 has a plurality of connecting portions 62' shown in FIG. 8A.

Figure 9A:
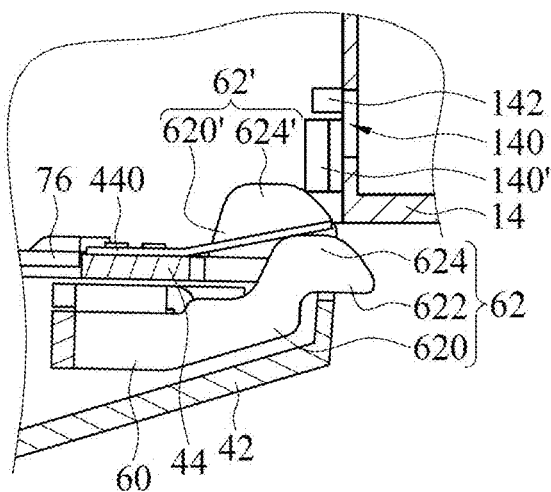
FIG. 9A, FIG. 9B, and FIG. 9C illustrate each a partial cross-sectional view of a perspective 7-7 in FIG. 1 according to some embodiments, and a schematic diagram of actions of a plurality of connecting portions when a detachable cover module pivots toward a closed position.
Figure 9B:
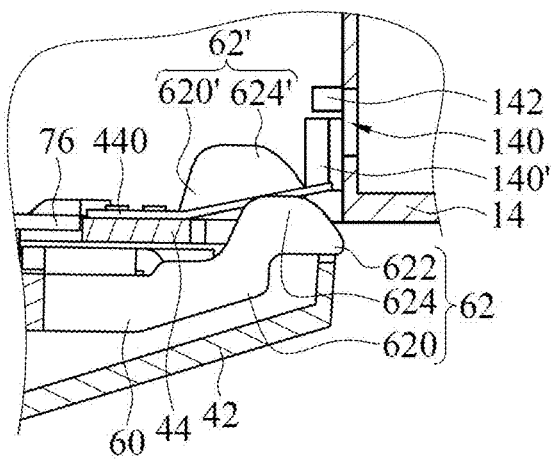
Figure 9C:
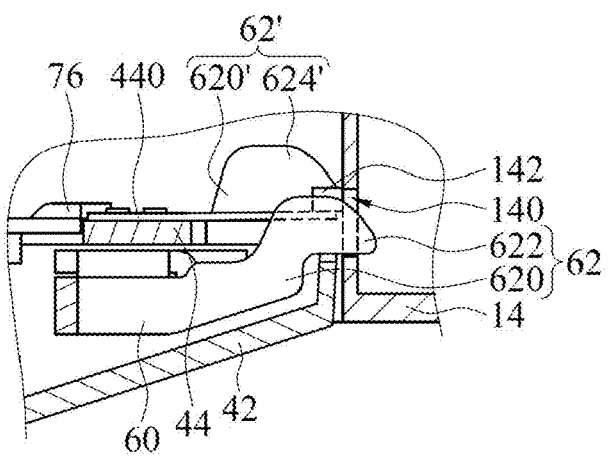

In some embodiments, the sliding member 60 has a connecting portion 62' shown in FIG. 8A and at least one connecting portion 62 shown in FIG. 7A. In the embodiment shown in FIG. 4, there is one inner tongue 62', and there are three side tongues 62. Referring to FIG. 9A to FIG. 9C together, FIG. 9A to FIG. 9C are each a partial cross-sectional view of a perspective 7-7 in FIG. 1, showing an embodiment of a connecting portion 62' of FIG. 8A and a connecting portion 62 of FIG. 7A, which is not limited thereto. Referring to FIG. 2, in this embodiment, the closed column 14 includes a plurality of latch portions 140, 140': at least one engagement hole 140 and a convex hull 140'. The convex hull 140' protrudes from the closed column 14 toward the pivot column 12. The sliding member 60 has a plurality of connecting portions 62, 62': an inner tongue 62' and at least one side tongue 62. The inner tongue 62' has a tongue body 620' and an inner convex portion 624', the inner convex portion 624' protruding outward from the bezel body 40 toward the opening direction from the tongue body 620'. Each of the at least one side tongue 62 has a tongue body 620 and a side convex portion 622, each of the side convex portions 622 protruding outward from the tongue body 620 toward a protruding position. When the detachable cover module 30 pivots toward the closed position 36 and approaches the closed column 14, the convex hull 140' pushes the inner convex portion 624' to move the sliding member 60 toward the retracted position and the at least one side convex portion 622 being in no contact with the closed column 14 (as shown in FIG. 9A and FIG. 9B). When the detachable cover module 30 is located at the closed position 36 and the button 50 is not located at the second position, the inner convex portion 624' is engaged with the convex hull 140', and the at least one side convex portion 622 is located in the engagement hole 140 (as shown in FIG. 9C). In other words, as shown in FIG. 4, the sliding member 60 is an integral structure. When the detachable cover module 30 pivots toward the closed position 36 and approaches the closed column 14, the convex hull 140' pushes the inner convex portion 624' of the inner tongue 62' to move toward the bezel body 40, and drives the side tongue 62 to move toward the bezel body 40 (that is, the sliding member 60 moves toward the retracted position), which can prevent the surface of the closed column 14 from being worn or scratched due to the repeated opening and closing of the detachable cover module 30.

Therefore, the embodiments of FIG. 9A to FIG. 9C can avoid the contact between the surface of the closed column 14 and the connecting portions 62, 62', and also can maintain the detachable cover module 30 at the closed position 36 better.

The side tongue 62 shown in the embodiment of FIG. 9A has an inner convex portion 624, but as described above, when the detachable cover module 30 is close to the closed column 14, the convex hull 140' will push the inner convex portion 624' of the inner tongue 62' to move the sliding member 60 toward the retracted position. Therefore, the side tongue 62 will not be in contact with the closed column 14, and the inner convex portion 624 of the side tongue 62 can be omitted.

Referring to FIG. 2 and FIG. 9A together, in some embodiments, a chassis body 10 has a blocking rib 142 located at the closed column 14, and the detachable cover module 30 includes a pre-force element 440. When the detachable cover module 30 is located at the closed position 36, the pre-force element 440 pushes the blocking rib 142 and has a force (as shown in FIG. 9C) that normally pushes the detachable cover module 30 away from the closed position 36. Therefore, when the user presses the button 50 to make the connecting portion 62 separate from the latch portion 140, the pre-force element 440 releases the force and pivots the detachable cover module 30 in a direction away from the closed position 36 (as shown in FIG. 9A). In some embodiments, the pre-force element 440 is a leaf spring (as shown in FIG. 2 and FIG. 9A). One end of the leaf spring is fixed to the detachable cover module 30 and the other end is a free end. In the embodiment of FIG. 2, the leaf spring is fixed to the sheet body 44. When the detachable cover module 30 pivots and approaches the closed position 36, the free end of the leaf spring is in contact with the blocking rib 142. When the detachable cover module 30 is at the closed position 36, the leaf spring stores the force of returning to the original state.

Referring to FIG. 2 and FIG. 3 together, in some embodiments, the chassis body 10 has a blocking rib 142, 142' separately disposed on the closed column 14. The detachable cover module 30 includes a plurality of pre-force elements 440, 440'. The pre-force elements 440, 440' correspond to the blocking rib 142, 142' and are located on the detachable cover module 30, of which the actions are not described again.

Referring to FIG. 4, in some embodiments, the detachable cover module 30 includes a friction member 38. The friction member 38 is in contact with the sliding member 60 and configured to generate a friction force (as shown in the schematic diagram of FIG. 10D) when the sliding member 60 moves. The friction member 38 is disposed on the bezel body 40 of the detachable cover module 30 and approaches the sliding member 60. By disposing the friction member 38, hand feeling of the user when pressing the button 50 may be adjusted. In addition, when the user releases the button 50, the friction member 38 may slow down the speed at which the first elastic member 80 pushes the sliding member 60 to the protruding position.

Figure 10A:
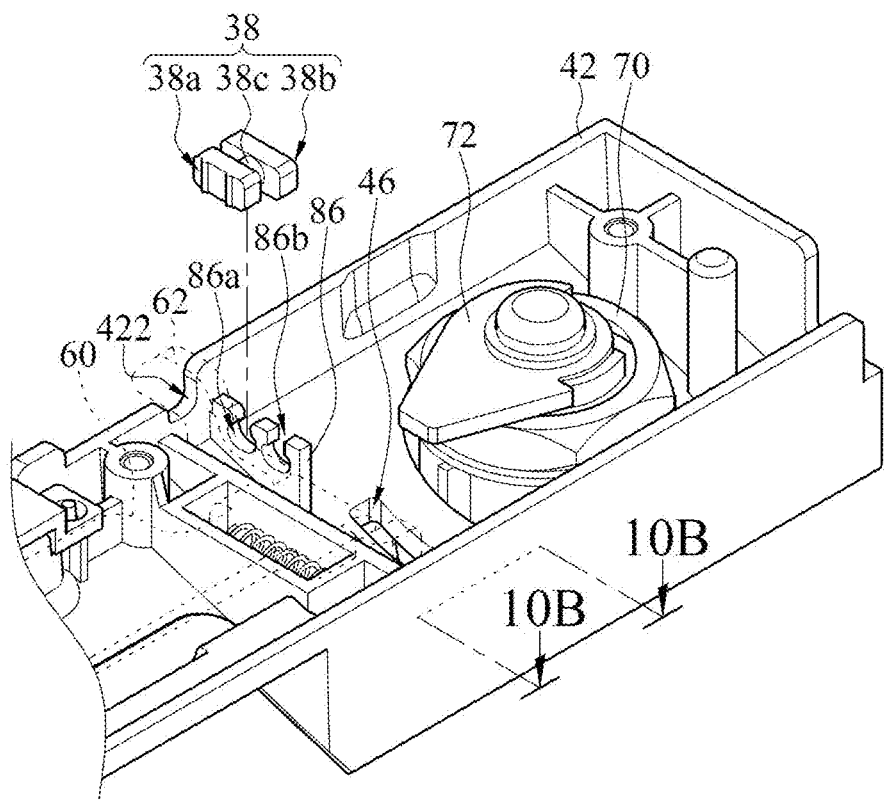
FIG. 10A, FIG. 10B, and FIG. 10C illustrate each a schematic structural diagram of a friction member and a sliding member according to some embodiments.
Figure 10B:
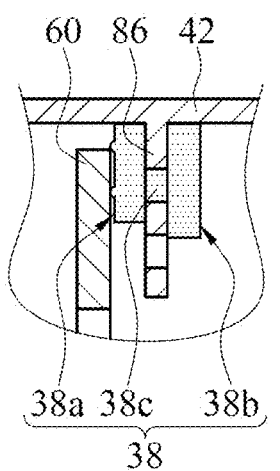
Figure 10C:
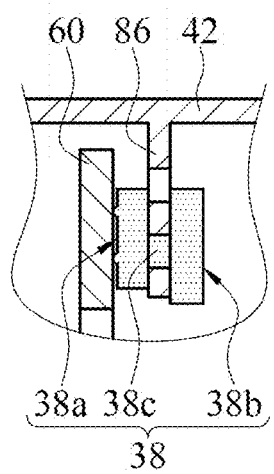
Figure 10D:
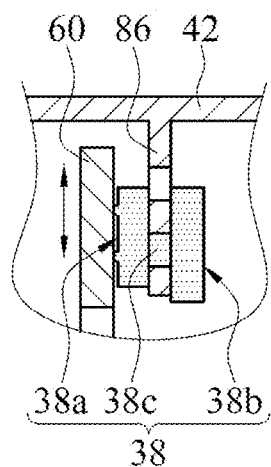
FIG. 10D illustrates a schematic diagram of actions of a friction member and a sliding member according to some embodiments.

FIG. 10A, FIG. 10B, FIG. 10C, and FIG. 10D each illustrate a schematic diagram of structures and actions of a friction member 38 and a sliding member 60 according to some embodiments. FIG. 10B, FIG. 10C, and FIG. 10D are cross-sectional views of a position 10B-10B in FIG. 10A, and the cross-sectional position is a horizontal cut surface (a position of the cut surface is lower than that of the guide groove 422) across the friction member 38 in FIG. 10A. In some embodiments, the bezel body 40 has a positioning portion 86, when the friction member 38 is located at the positioning portion 86, a surface of the friction member 38 being in contact with the sliding member 60. In some embodiments, the friction member 38 has two contact surfaces 38a, 38b (FIG. 10A), friction coefficients of the contact surfaces 38a, 38b substantially differing from each other. In the embodiment of the friction member 38 in FIG. 10A, the second contact surface 38b is a smooth surface, and the first contact surface 38a is a patterned surface, the friction coefficients of the two being different. In some embodiments, the two contact surfaces 38a, 38b may be made of materials with different friction coefficients.

When the friction member 38 is fixed to the positioning portion 86, one of the contact surfaces 38a, 38b may be selectively in contact with the sliding member 60. Therefore, the user may choose one of the contact surfaces 38a, 38b to be in contact with the sliding member 60 to generate different frictional forces, and then have different hand feelings of pressing the button 50, and different speeds (as shown in FIG. 10D) at which the sliding member 60 returns to the protruding position.

In some embodiments, the positioning portion 86 is a multi-section positioning portion configured to fix the friction member 38 to a plurality of sections. When the friction member 38 is selectively located on one of the sections, different friction forces are generated between the friction member 38 and the sliding member 60. As shown in FIG. 10A, the multi-section positioning portion has a plurality of positioning points 86a, 86b. FIG. 10B shows the friction member 38 located at the first positioning point 86a, and FIG. 10C shows the friction member 38 located at the second positioning point 86b. As shown in FIG. 10B and FIG. 10C, when the friction member 38 is located at the first positioning points 86a and the second positioning point 86b, contact areas between the friction member 38 and the sliding member 60 are different. Therefore, when the sliding member 60 moves, a friction force generated between the friction member 38 located at the first positioning point 86a and the sliding member 60 is different from a friction force generated between the friction member 38 located at the second positioning point 86b and the sliding member 60. Therefore, the user may selectively place the friction member 38 on one of the positioning points 86a, 86b to obtain different hand feelings of pressing the button 50 and different speeds at which the sliding member 60 is reset. In some embodiments, the positioning portion 86 is a multi-section positioning portion, and the friction member 38 has two contact surfaces 38a, 38b. Through matching of the multi-section positioning portions 86a, 86b and the two contact surfaces 38a, 38b, four different friction forces may be generated between the friction member 38 and the sliding member 60, which is convenient for the user to choose.

Referring to 10A, in some embodiments, the positioning points 86a, 86b are slots, and the friction member 38 has a connecting post 38c, the connecting post 38c being selectively positioned at one of the positioning points 86a, 86b, which is convenient for the user to position the friction member 38 as required.

Figure 10E:
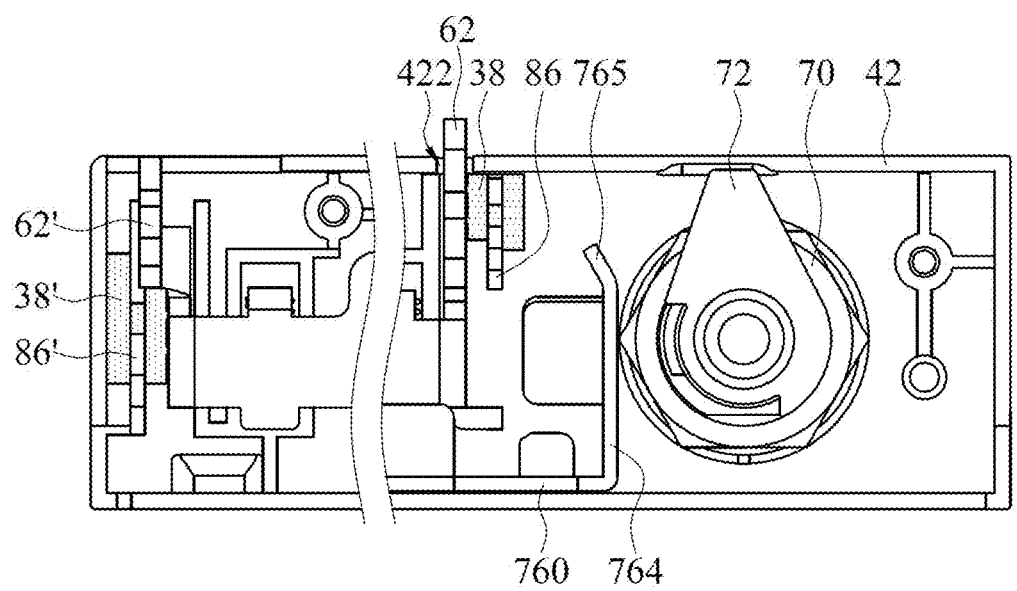
FIG. 10E illustrates a schematic structural diagram of a friction member and a sliding member according to some embodiments.

FIG. 10E illustrates a schematic structural diagram of a friction member and a sliding member according to some embodiments, which is a top view from a perspective of FIG. 10A. In some embodiments, the detachable cover module 30 includes a plurality of friction members 38, 38', and the bezel body 40 has a plurality of positioning portions 86, 86'. The friction members 38, 38' may be selectively located at the positioning portions 86, 86', and the user may selectively use one or more friction members 38, 38' to generate different pressing feelings. The embodiment of FIG. 10E has two friction members 38, 38' and two positioning portions 86, 86', which is not limited thereto during implementation. The friction members 38, 38' may each have a plurality of contact surfaces 38a, 38b, and the positioning portions 86, 86' may each have a plurality of positioning points 86a, 86b.

Figure 10F:
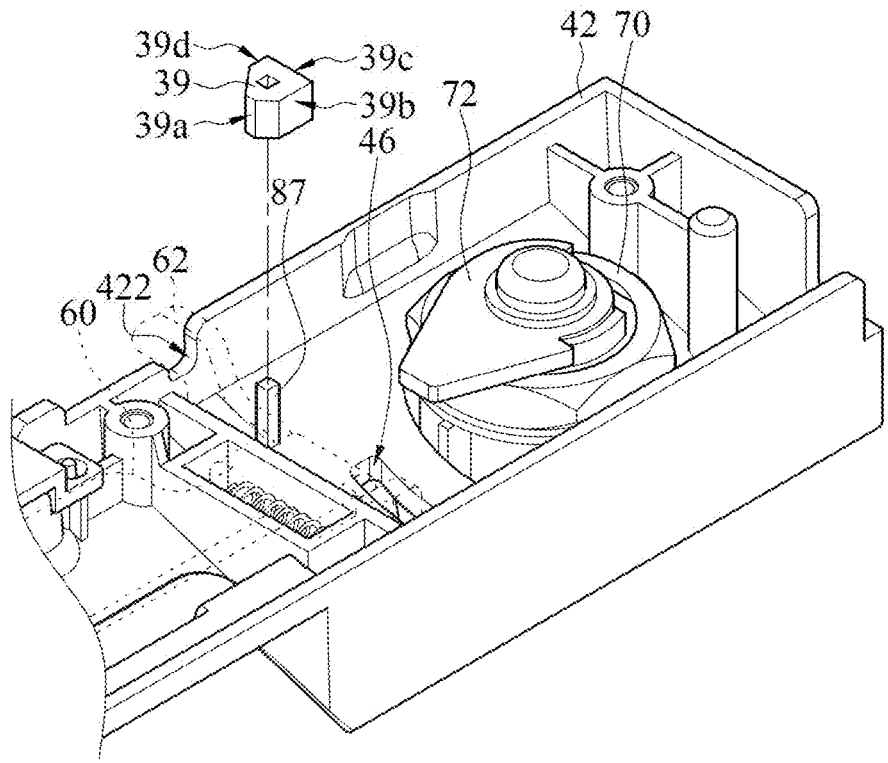
FIG. 10F and FIG. 10G illustrate each a schematic structural diagram of a friction member and a positioning portion according to some embodiments, where
Figure 10G:
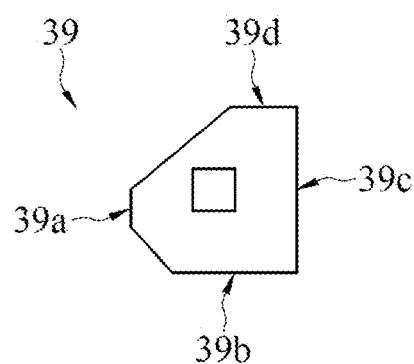

FIG. 10F and FIG. 10G each illustrate a schematic structural diagram of a friction member 39 and a positioning portion 87 according to some embodiments. FIG. 10G is a top view of the friction member 39 of FIG. 10F. In some embodiments, a detachable cover module 30 includes a friction member 39, and a bezel body 40 has a positioning portion 87. The friction member 39 has a plurality of contact surfaces 39a, 39b, 39c, 39d, areas of the contact surfaces 39a, 39b, 39c, 39d differing from each other. When the friction member 39 is fixed to the positioning portion 87, one of the contact surfaces 39a, 39b, 39c, 39d may be selectively in contact with a sliding member 60. Therefore, the user may select one of the contact surfaces 39a, 39b, 39c, 39d to be in contact with the sliding member 60, to adjust different pressing feelings.

Figure 11A:
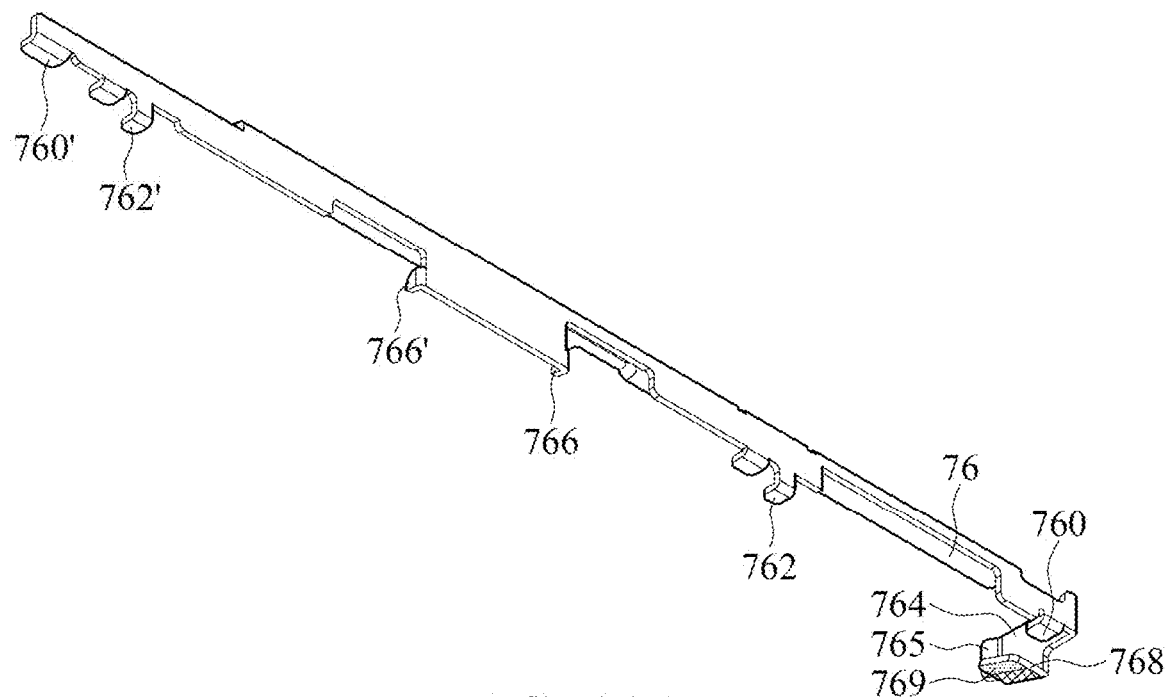
FIG. 11A illustrates a three-dimensional view of a blocking rod according to some embodiments.
Figure 11B:
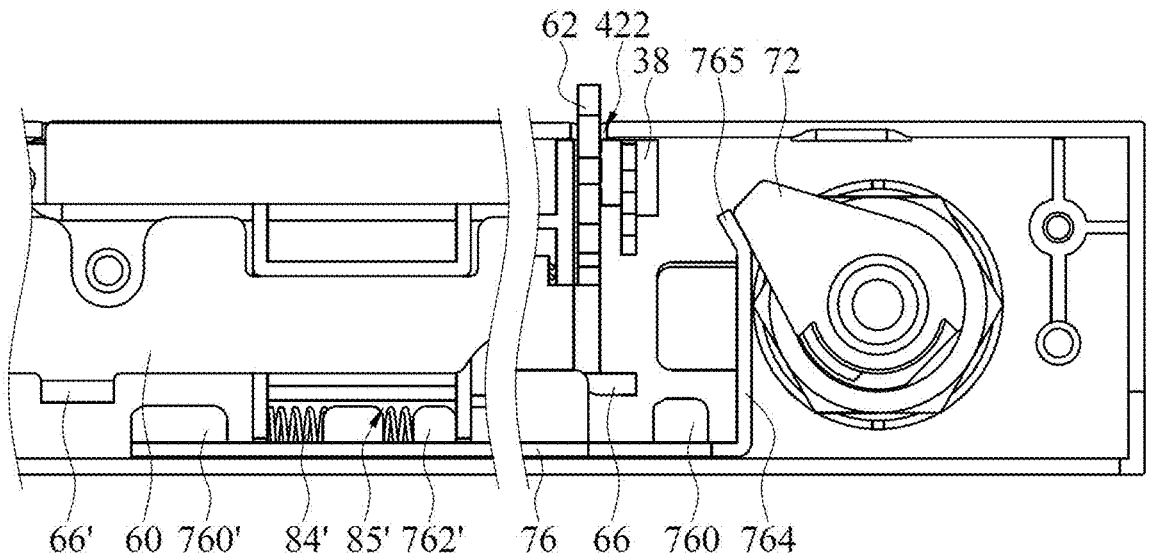
FIG. 11B and FIG. 11C illustrate each a schematic diagram of actions of a lock, a blocking rod, and a third elastic member according to some embodiments.
Figure 11C:
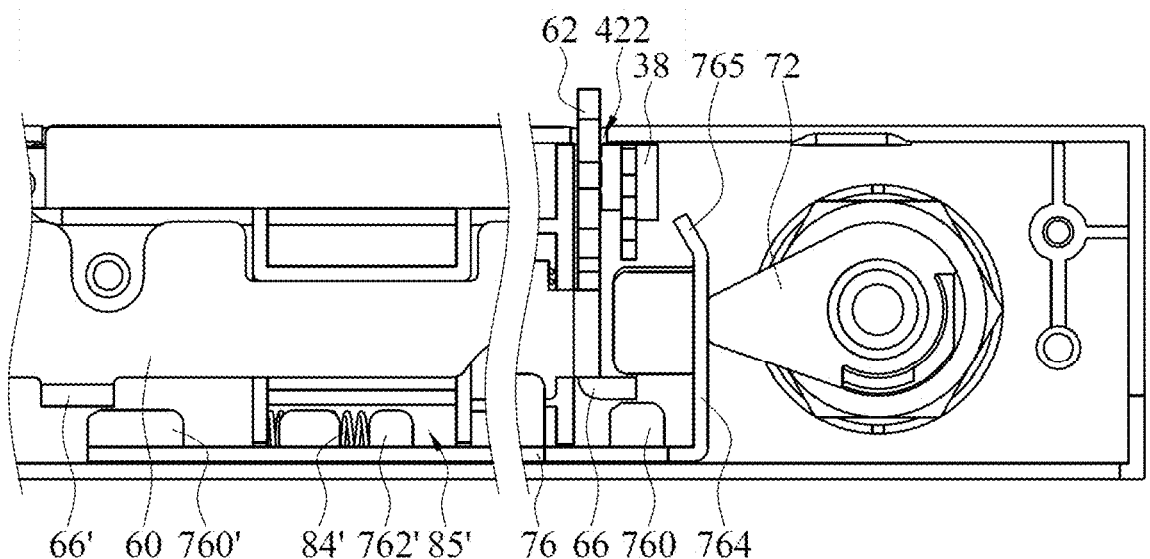

Referring to FIG. 4, in some embodiments, the detachable cover module 30 further includes a lock 70, a blocking rod 76, and a third elastic member 84. Reference is made to FIG. 11A, FIG. 11B, and FIG. 11C for reading. FIG. 11A illustrates a three-dimensional view of a blocking rod according to some embodiments. FIG. 11A and FIG. 4 each illustrate a three-dimensional view of the blocking rod 76 from different perspectives. FIG. 11B and FIG. 11C are each a schematic diagram of actions of a lock, a blocking rod, and a third elastic member according to some embodiments. The lock 70 includes a tongue 72 selectively located at a locked position (a position of the tongue 72 shown in FIG. 11C) and an unlocked position (a position of the tongue 72 shown in FIG. 10E). The blocking rod 76 is slidably disposed on the bezel body 40 and moves between a blocking position (a position of the blocking rod 76 shown in FIG. 11C) and a non-blocking position (a position of the blocking rod 76 shown in FIG. 10E). The blocking rod 76 has a blocking tongue 760, when the tongue 72 moves from an unlocked position to a locked position (the tongue 72 passes through the position of FIG. 11B in a rotating manner from the position of FIG. 10E to the position of FIG. 11C), the tongue 72 pushes the blocking rod 76 to move toward the blocking position. When the blocking rod 76 is located at the blocking position, the blocking tongue 760 prevents the sliding member 60 from moving toward the retracted position, that is, prevents the connecting portion 62 from moving toward a position not protruding from the bezel body 40 (as shown in the FIG. 11B). The third elastic member 84 has a force that normally pushes the blocking rod 76 toward the non-blocking position.

In some embodiments, the blocking rod 76 has a pushed sheet 764. When the tongue 72 rotates toward the locked position, the tongue 72 pushes the pushed sheet 764 and causes the blocking rod 76 to move toward the blocking position. In some embodiments, the pushed sheet 764 has a guiding portion 765 configured to guide the tongue 72 to be in contact with the pushed sheet 764 more smoothly. In some embodiments, the sliding member 60 has a top block 66 corresponding to the blocking tongue 760. When the blocking rod 76 is located at the blocking position, the blocking tongue 760 pushes the top block 66, so that the sliding member 60 fails to move toward the retracted position.

Therefore, when the detachable cover module 30 is located at the closed position, the sliding member 60 is located at the protruding position (as shown in FIG. 11B). The connecting portion 62 of the sliding member 60 is located at the latch portion 140. In this case, when the user uses a key to turn the lock 70 to perform a locking action, the tongue 72 rotates from the unlocked position to the locked position, and the tongue 72 pushes the pushed sheet 764 to move the blocking rod 76 toward the blocking position. When the blocking rod 76 is located at the blocking position, the blocking tongue 760 pushes the top block 66 to prevent the sliding member 60 from moving toward the retracted position. Then, when the user uses the key to rotate the lock 70 to perform an unlocking action, the tongue 72 rotates from the locked position to the unlocked position. When the tongue 72 rotates to be in no contact with the blocking rod 76, the third elastic member 84 pushes the blocking rod 76 toward the non-blocking position until the blocking rod 76 reaches the non-blocking position (the position shown in FIG. 11A or FIG. 10E).

Referring to FIG. 11A again, in some embodiments, the blocking rod 76 has a lug 762. The side plate 42 of the bezel body 40 has a second groove 85 (see FIG. 4) configured to accommodate the third elastic member 84 and the lug 762. The third elastic member 84 is a compression spring. One end of the compression spring is in contact with the second groove 85, and the other end thereof is in contact with the lug 762. Therefore, when the blocking rod 76 moves from the non-blocking position to the blocking position, the lug 762 compresses the third elastic member 84, and when the tongue 72 rotates toward the unlocked position without being in contact with the blocking rod 76, the third elastic member 84 pushes the blocking rod 76 toward the non-blocking position.

Referring to FIG. 4, in some embodiments, the blocking rod 76 has two lugs 762, 762' (see FIG. 11B and FIG. 11C), and the detachable cover module 30 has two third elastic members 84, 84' (shown in FIG. 11B and FIG. 11C), the third elastic members 84, 84' each having a force that normally pushes the blocking rod 76 toward the non-blocking position. With an increase of the number of the third elastic members 84, 84', the force that normally pushes the blocking rod 76 toward the non-blocking position may be increased.

Referring to 11A, 11B, and 11C, in some embodiments, the blocking rod 76 has a plurality of blocking tongues 760, 760', and the sliding member 60 has a plurality of top blocks 66, 66', the top blocks 66, 66' being separately disposed on a rod portion 61 of the sliding member 60, and the blocking tongues 760, 760' being disposed corresponding to the top blocks 66, 66'. When the blocking rod 76 is located at the blocking position, the blocking tongues 760, 760' each push the top blocks 66, 66', so that the sliding member 60 can be prevented from moving toward the retracted position more stably.

Figure 12A:
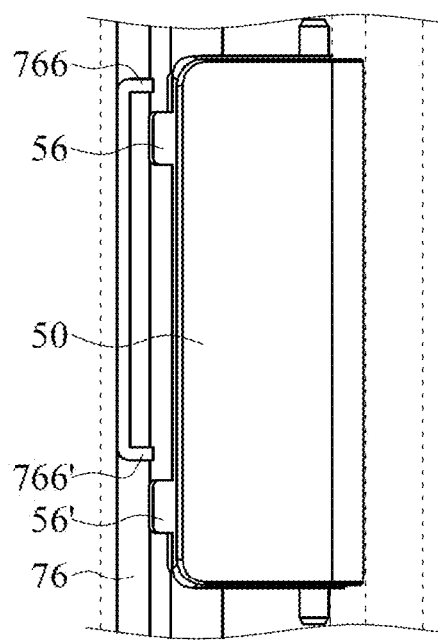
FIG. 12A, FIG. 12B, and FIG. 12C illustrate each a schematic diagram of actions of a blocking rod and a button according to some embodiments, where FIG. 12A and FIG.
Figure 12B:
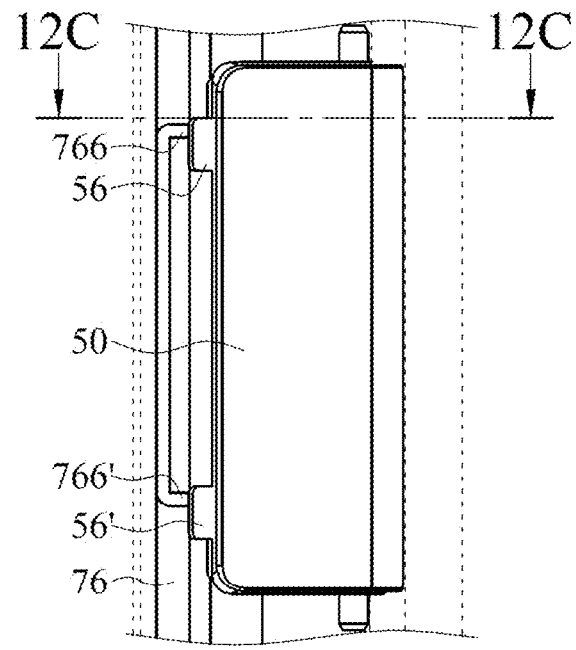
Figure 12C:
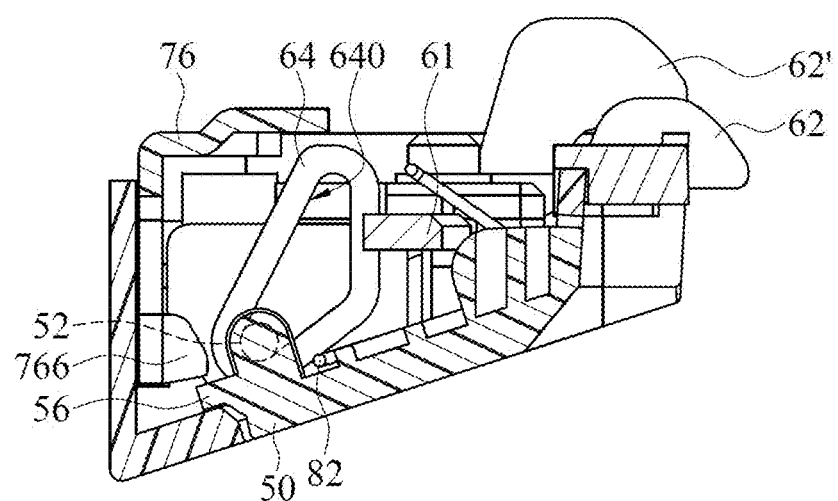

FIG. 12A, FIG. 12B, and FIG. 12C each illustrate a schematic diagram of actions of a blocking rod and a button according to some embodiments. FIG. 12A and FIG. 12B each illustrate a partial front view of a vicinity of the button 50 in FIG. 1. FIG. 12C is a cross-sectional view of a position 12C-12C in FIG. 12B. In some embodiments, the blocking rod 76 has a blocking portion 766, and when the blocking rod 76 is located at the blocking position, the blocking portion 766 limits the button 50 to prevent the button 50 from pivoting toward a second position (as shown in FIG. 12B and FIG. 12C). In some embodiments, the blocking portion 766 corresponds to a limiting member 56 of the button 50. When the blocking rod 76 is located at the non-blocking position (as shown in FIG. 12A), the blocking portion 766 is not in contact with the limiting member 56. Therefore, the button 50 may be pressed down. When the blocking rod 76 is located at the blocking position (as shown in FIG. 12B and FIG. 12C), the blocking portion 766 pushes the limiting member 56, that is, the blocking portion 766 prevents the button 50 from pivoting toward the second position. In some embodiments, the blocking rod 76 has a plurality of blocking portions 766, 766'. When the button 50 is located at a first position and the blocking rod 76 is located at the blocking position, the blocking portions 766, 766' push the limiting members 56, 56' to prevent the button 50 from pivoting toward the second position more stably.

Figure 13A:
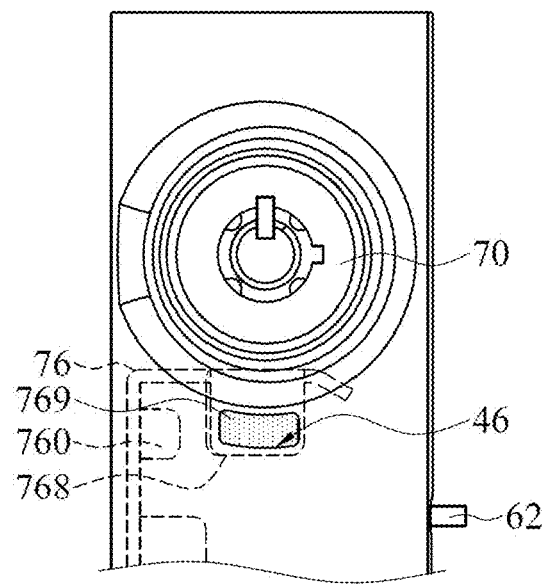
FIG. 13A and FIG. 13B illustrate each a schematic diagram of actions of a side plate and a state element according to some embodiments.
Figure 13B:
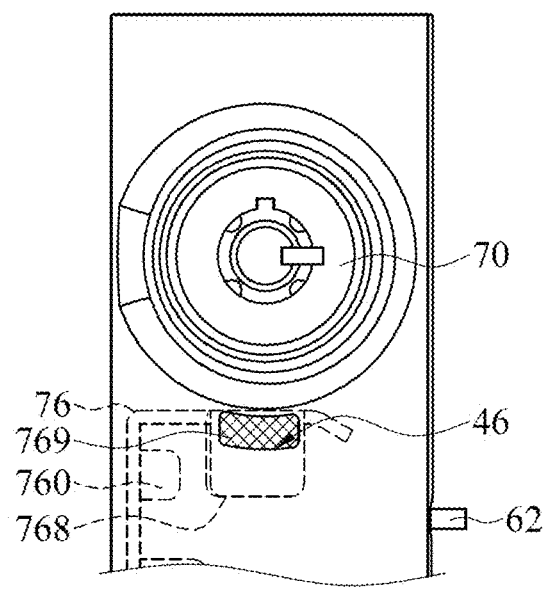

FIG. 13A and FIG. 13B each illustrate a schematic diagram of actions of a side plate and a state element according to some embodiments. In some embodiments, the blocking rod 76 has a state element 768 (also shown in FIG. 4 and FIG. 11A). A bezel body 40 has a window 46 corresponding to the state element 768, a visible state presented by the state element 768 through the window 46 existing when the blocking rod 76 is located at the blocking position being different from a visible state presented by the state element 768 through the window 46 existing when the blocking rod 76 is located at the non-blocking position. Accordingly, a user may be allowed to learn the usage status of a lock 70 and the bezel body 40, for example, whether the lock 70 (the tongue 72) is at the locked position or the unlocked position.

In some embodiments, the state element 768 has a visible surface 769 facing the window 46. When the blocking rod 76 is selectively located at the blocking position and the non-blocking position, the user may observe the visible surface 769 through the window 46. When the blocking rod 76 is at the blocking position, the user can observe a part (referred to as a first region below) of the visible surface 769 through the window 46. When the blocking rod 76 is at the non-blocking position, the user can observe another part (referred to as a second region below) of the visible surface 769 through the window 46. The first region and the second region have different visual effects (that is, the foregoing visual state is shown in FIG. 11A). Therefore, the user can learn, from the visual state observed through the window 46, whether the blocking rod 76 is located at the blocking position or the non-blocking position. In some embodiments, when the blocking rod 76 is located at the blocking position, the visible state is red (for example, the first region has a red coating). When the blocking rod 76 is located at the non-blocking position, the visible state is green (for example, the second region has a green coating).

In some embodiments, when the blocking rod 76 is at the blocking position, the user can observe the visible surface 769 through the window 46. When the blocking rod 76 is at the non-blocking position, the user cannot observe the visible surface 769 through the window 46. Therefore, the blocking rod 76 is selectively located at the blocking position and the non-blocking position, and the visual states (the visual surface 769 is visible and invisible) observed by the user through the window 46 are different, that is, visual states presented by the state element 768 through the window 46 are different.

Based on the above, a detachable cover module 30 and a chassis having the detachable cover module 30 are provided. The detachable cover module 30 may be matched with the chassis body 10 of FIG. 1, or may be matched with other chassis bodies. According to some embodiments, when the button 50 of the detachable cover module 30 is pressed, the pushing member 52 of the button 50 pushes the guiding element 64 of the sliding member 60, so that the connecting portion 62 of the sliding member 60 retracts from the position (that is, the position at which the sliding member 60 retracts) protruding outward from the bezel body 40. According to some embodiments, the body 10 of the chassis has a latch portion 140. When the detachable cover module 30 is at the closed position, the connecting portion 62 is located at the latch portion 140, so that the detachable cover module 30 covers the opening 16 of the chassis body 10. According to some embodiments, when the button of the detachable cover module 30 is released from a pressed state, a first elastic member 80 restores the connecting portion 62 to a position (that is, the protruding position of the sliding member 60) protruding from the bezel body 40. According to some embodiments, when the button of the detachable cover module 30 is released from a pressed state, the first elastic member 80 further restores the button 50 to a state (a first position of the button 50) of not being pressed. According to some embodiments, when the button of the detachable cover module 30 is released from a pressed state, a second elastic member 82 restores the button 50 to a state (a first position of the button 50) of not being pressed. According to some embodiments, when the button 50 is at the first position, the limiting member 56 of the button 50 aligns the surface of the button 50 with the surface of the side plate 42.

According to some embodiments, the friction member 38 of the detachable cover module 30 is in contact with the sliding member 60. When the sliding member 60 moves, a friction force is generated between the friction member 38 and the sliding member 60, thereby adjusting the hand feeling of pressing the button 50 and the speed at which the sliding member 60 returns to the protruding position. According to some embodiments, the friction member 38 is selectively in contact with the sliding member 60 with different contact surfaces 38*a*, 38*b*, friction coefficients of the contact surfaces 38*a*, 38*b* being different, which are used for the user to select the desired feel. According to some embodiments, the friction member 38 is selectively positioned at different positions to form different contact areas between the friction member and the sliding member 60 for the user to select the desired hand feeling.

According to some embodiments, when the detachable cover module 30 is pivoted to the closed position, the inner convex portion 624 of the connecting portion 62 is pushed by the closed column 14 of the chassis body 10 to cause the connecting portion 62 to retract, to guide the side convex portion 622 of the connecting portion 62 entering the latch portion 140 of the closed column 14. According to some embodiments, when the detachable cover module 30 is pivoted to the closed position, the inner convex portion 624' of the connecting portion 62' is pushed by the convex hull 140' of the closed column 14 to cause the connecting portion 62 to retract, thereby preventing the connecting portion 62' from wearing the surface of the closed column 14. According to some embodiments, the detachable cover module has a plurality of connecting portions 62, 62'. When the detachable cover module 30 is pivoted to the closed position, the inner convex portion 624' of the connecting portion 62' is pushed by the convex hull 140' of the closed column 14 to cause the connecting portion 62 to retract, thereby preventing the side convex portion 622 of the connecting portion 62 from wearing the surface of the closed column 14.

According to some embodiments, when the detachable cover module 30 is pivoted to the closed position, the pre-force element 440 of the detachable cover module 30 is pushed by the blocking rib 142 of the chassis body and has a force that moves the detachable cover module 30 away from the closed position. Therefore, when the button 50 is pressed to cause the connecting portion 62 to move away from the latch portion 140, the pre-force element 440 pushes the detachable cover module 30 away from the closed position.

According to some embodiments, when the sliding member 60 is located at the protruding position and the tongue 72 of the lock 70 rotates toward the locked position, the tongue 72 pushes the blocking rod 76 toward the blocking position. When the blocking rod 76 is located at the blocking position, the blocking tongue 760 of the blocking rod 76 limits the sliding member 60, so that the sliding member 60 cannot move toward the retracted position, that is, the movement of the connecting portion 62 is limited. According to some embodiments, the third elastic member 84 has a force that normally pushes the blocking rod 76 toward the non-blocking position. Therefore, when the tongue 72 rotates toward the unlocked position without being in contact with the blocking rod 76, the third elastic member 84 pushes the blocking rod 76 toward the non-blocking position.

According to some embodiments, when the button 50 is located at the first position and the tongue 72 of the lock 70 rotates toward the locked position, the tongue 72 pushes the blocking rod 76 toward the blocking position. When the blocking rod 76 is located at the blocking position, the blocking portion 766 of the blocking rod 76 limits the button 50, so that the button 50 cannot pivot toward the second position.

According to some embodiments, when the tongue 72 of the lock 70 is respectively located at the locked position and the unlocked position, the visual states presented by the state element 768 through the window 46 are different. It is convenient for the user to observe and learn whether (the tongue 72 of) the lock 70 is at the unlocked position or the locked position.

What is claimed is:

1. A detachable cover module, comprising:
   a bezel body;
   a button, one end thereof being pivotally connected to the bezel body, and the button comprising a pushing member; and
   a sliding member comprising a connecting portion and a guiding element, when the button is pressed in a first direction, the pushing member pushing the guiding element, so that the connecting portion of the sliding member moves in a second direction from a position protruding outward from the bezel body toward a position not protruding outward from the bezel body, wherein an included angle is formed between the first direction and the second direction.

2. The detachable cover module according to claim 1, further comprising a first elastic member and a second elastic member, wherein the button pivots between a first position and a second position, the first elastic member has a force that normally pushes the sliding member toward a protruding position and the second elastic member has a force that normally pushes the button toward the first position.

3. The detachable cover module according to claim 1, wherein the sliding member has a rod portion, the guiding element is fixed to the rod portion and has a guiding surface, when the button is pressed, the pushing member pushes the guiding surface.

4. The detachable cover module according to claim 3, wherein the guiding element comprises a hollow portion, the pushing member penetrates into the hollow portion and is configured to slide along the guiding surface.

5. The detachable cover module according to claim 1, wherein the connecting portion has a tongue body, a side convex portion, and an inner convex portion, the side convex portion protrudes outward from the tongue body toward a protruding position, and the inner convex portion protrudes outward from the tongue body toward a closing direction of the bezel body from the tongue body.

6. The detachable cover module according to claim 1, wherein the sliding member has a plurality of the connecting portions, the plurality of the connecting portions are an inner tongue and at least one side tongue, the inner tongue has a tongue body and an inner convex portion, the inner convex portion protrudes outward from the tongue body toward a closing direction of the bezel body, each of the at least one side tongue has a tongue body and a side convex portion, and each of the side convex portions protrudes outward from the tongue body toward a protruding position.

7. The detachable cover module according to claim 1, further comprising a friction member having a plurality of contact surfaces, friction coefficients of the contact surfaces substantially differing from each other, wherein the bezel body has a positioning portion, when the friction member is located at the positioning portion, one of the contact surfaces being selectively in contact with the sliding member, and when the sliding member moves, a friction force being generated.

8. The detachable cover module according to claim 1, further comprising a friction member, wherein the friction member is in contact with the sliding member and configured to generating a friction force when the sliding member moves, the bezel body has a multi-section positioning portion configured to fix the friction member to a plurality of sections, when the friction member is selectively located on the plurality of sections, different friction forces being generated between the friction member and the sliding member.

9. The detachable cover module according to claim 1, further comprising:
a lock comprising a tongue selectively located at a locked position and an unlocked position;
a blocking rod slidably disposed on the bezel body to move between a blocking position and a non-blocking position, the blocking rod having a blocking tongue, wherein when the tongue moves from the unlocked position to the locked position, the tongue pushes the blocking rod to move toward the blocking position, and when the blocking rod is located at the blocking position, the blocking tongue prevents the connecting portion of the sliding member from moving toward the position not protruding outward from the bezel body; and
a third elastic member having a force that normally pushes the blocking rod toward the non-blocking position.

10. The detachable cover module according to claim 1, further comprising:
a friction member in contact with the sliding member and being configured to generate a friction force when the sliding member moves, wherein the bezel body has a multi-section positioning portion configured to fix the friction member to a plurality of sections, when the friction member is selectively located on the plurality of sections, different friction forces are generated between the friction member and the sliding member; and the friction member has a plurality of contact surfaces, friction coefficients of the contact surfaces substantially differ from each other, and when the friction member is located at one of the sections, one of the contact surfaces is selectively in contact with the sliding member;
a lock comprising a tongue selectively located at a locked position and an unlocked position;
a blocking rod slidably disposed on the bezel body to move between a blocking position and a non-blocking position, the blocking rod having a blocking tongue and a blocking portion, wherein when the tongue moves from the unlocked position to the locked position, the tongue pushes the blocking rod to move toward the blocking position, when the blocking rod is located at the blocking position, the blocking tongue prevents the connecting portion of the sliding member from moving toward the position not protruding outward from the bezel body, and when the blocking rod is located at the blocking position, the blocking portion prevents the button from pivoting as a result of being pressed;
a first elastic member having a force that normally pushes the sliding member toward a protruding position;
a second elastic member having a force that normally pushes the button toward the first position; and
a third elastic member having a force that normally pushes the blocking rod toward the non-blocking position, wherein
the blocking rod has a state element, the bezel body having an opening corresponding to the state element, wherein a visible state presented by the state element through the opening when the blocking rod is located at the blocking position is different from a visible state presented by the state element through the opening when the blocking rod is located at the non-blocking position, wherein
the sliding member has a rod portion, the guiding element is fixed to the rod portion and has a guiding surface, when the button is pressed, the pushing member pushes the guiding surface; and
the sliding member has a plurality of the connecting portions, the plurality of the connecting portions is an inner tongue and at least one side tongue, the inner tongue has a tongue body and an inner convex portion, the inner convex portion protrudes outward from the tongue body toward a closing direction of the bezel body from the tongue body, each of the at least one side tongue has a tongue body and a side convex portion, and each of the side convex portions protrudes outward from the bezel body toward a protruding position from the tongue body.

11. A chassis, comprising:
a chassis body having a pivot column and a closed column, an opening being between the pivot column and the closed column, and the closed column having a latch portion; and
a detachable cover module, one side of the detachable cover module being pivotally disposed on the pivot column so that the detachable cover module pivots between an open position and a closed position, and the detachable cover module comprising:
a bezel body;
a button, one end thereof being pivotally connected to the bezel body, and the button comprising a pushing member; and
a sliding member comprising a connecting portion and a guiding element, when the button is pressed in a first direction, the pushing member pushing the guiding element, so that the connecting portion of the sliding member moves in a second direction from a position protruding outward from the bezel body toward a position not protruding outward from the bezel body, wherein an included angle is formed between the first direction and the second direction, and when the detachable cover module is located at the closed position and the connecting portion protrudes outward from the bezel body, the connecting portion is located on the latch portion.

12. The chassis according to claim 11, further comprising a first elastic member and a second elastic member, wherein the first elastic member has a force that normally pushes the sliding member toward a protruding position and the second elastic member has a force that normally pushes the button toward the first position.

13. The chassis according to claim 11, wherein the chassis body has a blocking rib located at the closed column, the detachable cover module comprises a friction member and a pre-force element, the friction member is in contact with the sliding member and configured to generate a friction force when the sliding member moves, and when the detachable cover module is located at the closed position, the pre-force element pushes the blocking rib and has a force that normally pushes the detachable cover module away from the closed position.

14. The chassis according to claim 11, wherein the sliding member has a rod portion, the guiding element is fixed to the rod portion and has a guiding surface, the guiding element comprises a hollow portion, the pushing member penetrates the hollow portion, and when the button is pressed, the pushing member pushes the guiding surface and is configured to slide along the guiding surface.

15. The chassis according to claim 11, wherein the latch portion is a convex hull protruding from the closed column toward the pivot column, the connecting portion has a tongue body and an inner convex portion, the inner convex portion protrudes outward from the bezel body toward an opening direction from the tongue body, when the detachable cover module pivots toward the closed position and approaches the closed column, the convex hull pushes the inner convex portion to move the sliding member toward the bezel body, and when the detachable cover module is located at the closed position and the button is not pressed, the inner convex portion is engaged with the convex hull.

16. The chassis according to claim 11, wherein the closed column comprises a plurality of the latch portions, the plurality of the latch portions is a convex hull and at least one engagement hole, the convex hull protrudes from the closed column toward the pivot column, the sliding member has a plurality of the connecting portions, the plurality of the connecting portions is an inner tongue and at least one side tongue, the inner tongue has a tongue body and an inner convex portion, the inner convex portion protrudes outward from the bezel body toward an opening direction from the tongue body, each of the at least one side tongue has a tongue body and a side convex portion, and each of the side convex portions protrudes outward from the tongue body toward a protruding position, when the detachable cover module pivots toward the closed position and approaches the closed column, the convex hull pushes the inner convex portion to move the sliding member toward the bezel body and the at least one side convex portion is in no contact with the closed column, and when the detachable cover module is located at the closed position and the button is not pressed, the inner convex portion being engaged with the convex hull and the at least one side convex portion is located in the engagement hole.

17. The chassis according to claim 11, wherein the detachable cover module further comprises a friction member having a plurality of contact surfaces, friction coefficients of the contact surfaces substantially differ from each other, the bezel body has a positioning portion, when the friction member is located at the positioning portion, one of the contact surfaces is selectively in contact with the sliding member, and when the sliding member moves, a friction force is generated.

18. The chassis according to claim 11, wherein the detachable cover module further comprises a friction member in contact with the sliding member, the friction member is configured to generate a friction force when the sliding member moves, the bezel body has a multi-section positioning portion configured to fix the friction member to a plurality of sections, when the friction member is selectively located on the sections, different friction forces are generated between the friction member and the sliding member.

19. The chassis according to claim 11, wherein the detachable cover module further comprises:
a lock comprising a tongue selectively located at a locked position and an unlocked position;
a blocking rod slidably disposed on the bezel body to move between a blocking position and a non-blocking position and having a blocking tongue, wherein when the tongue moves from the unlocked position to the locked position, the tongue pushes the blocking rod to move toward the blocking position, and when the blocking rod is located at the blocking position, the blocking rod prevents the connecting portion of the sliding member from moving toward the position not protruding outward from the bezel body; and
a third elastic member having a force that normally pushes the blocking rod toward the non-blocking position.

20. The chassis according to claim 11, wherein
the detachable cover module further comprises:
a friction member being in contact with the sliding member and configured to generate a friction force when the sliding member moves, wherein the bezel body has a multi-section positioning portion configured to fix the friction member to a plurality of sections, when the friction member is selectively located on the sections, different friction forces are generated between the friction member and the sliding member; and the friction member has a plurality of contact surfaces, friction coefficients of the contact surfaces substantially differ from each other, and when the friction member is located at one of the sections, one of the contact surfaces is selectively in contact with the sliding member;

a lock comprising a tongue selectively located at a locked position and an unlocked position;

a blocking rod slidably disposed on the bezel body to move between a blocking position and a non-blocking position, the blocking rod having a blocking tongue and a blocking portion, wherein when the tongue moves from the unlocked position to the locked position, the tongue pushes the blocking rod to move toward the blocking position, and when the blocking rod is located at the blocking position, the blocking rod prevents the connecting portion of the sliding member from moving toward the position not protruding outward from the bezel body, and the blocking portion prevents the button from pivoting as a result of being pressed;

a first elastic member having a force that normally pushes the sliding member toward a protruding position;

a second elastic member having a force that normally pushes the button toward the first position; and a third elastic member having a force that normally pushes the blocking rod toward the non-blocking position, wherein the blocking rod has a state element, the bezel body having a window corresponding to the state element, wherein a visible state of the state element presented through the window when the blocking rod is located at the blocking position is different from a visible state of the state element presented through the window when the blocking rod is located at the non-blocking position, wherein the closed column comprises a plurality of the latch portions, the plurality of the latch portions is a convex hull and at least one engagement hole, the convex hull protrudes from the closed column toward the pivot column, the sliding member has a plurality of the connecting portions, the plurality of the connecting portions is an inner tongue and at least one side tongue, the inner tongue has a tongue body and an inner convex portion, the inner convex portion protrudes outward from the bezel body toward an opening direction from the tongue body, each of the at least one side tongue has a tongue body and a side convex portion, and each of the side convex portions protrudes outward from the tongue body toward a protruding position, when the detachable cover module pivots toward the closed position and approaches the closed column, the convex hull pushes the inner convex portion to move the connecting portion of the sliding member toward the position not protruding outward the bezel body and the at least one side convex portion is in no contact with the closed column, and when the detachable cover module is located at the closed position and the button is not pressed, the inner convex portion is engaged with the convex hull, and the at least one side convex portion is located in the engagement hole, wherein the chassis body has a blocking rib located at the closed column, and the detachable cover module comprises a friction member and a pre-force element, the friction member is in contact with the sliding member and configured to generate a friction force when the sliding member moves, and when the detachable cover module is located at the closed position, the pre-force element pushes the blocking rib and has a force that normally pushes the detachable cover module away from the closed position; and the sliding member has a rod portion, the guiding element is fixed to the rod portion and has a guiding surface, when the button is pressed, the pushing member pushes the guiding surface.

* * * * *